(12) United States Patent
Nagase et al.

(10) Patent No.: US 11,296,219 B2
(45) Date of Patent: Apr. 5, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Senichirou Nagase, Tokyo (JP); Tsuyoshi Kachi, Tokyo (JP); Yoshinori Hoshino, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/827,150

(22) Filed: Mar. 23, 2020

(65) Prior Publication Data

US 2020/0321464 A1    Oct. 8, 2020

(30) Foreign Application Priority Data

Apr. 2, 2019    (JP) .............................. JP2019-070450

(51) Int. Cl.

| | |
|---|---|
| *H01L 29/78* | (2006.01) |
| *H01L 29/423* | (2006.01) |
| *H01L 29/66* | (2006.01) |
| *H01L 29/10* | (2006.01) |
| *H01L 29/40* | (2006.01) |

(52) U.S. Cl.
CPC ...... *H01L 29/7813* (2013.01); *H01L 29/1095* (2013.01); *H01L 29/407* (2013.01); *H01L 29/4236* (2013.01); *H01L 29/66734* (2013.01)

(58) Field of Classification Search
CPC ............. H01L 29/7813; H01L 29/4236; H01L 29/1095; H01L 29/0634
See application file for complete search history.

(56) References Cited

U.S. PATENT DOCUMENTS

| | | | | |
|---|---|---|---|---|
| 5,637,898 A | * | 6/1997 | Baliga ................. | H01L 29/0878 257/330 |
| 8,673,700 B2 | * | 3/2014 | Yedinak .............. | H01L 29/7811 438/156 |
| 2002/0070418 A1 | * | 6/2002 | Kinzer ................ | H01L 29/0634 257/496 |

(Continued)

FOREIGN PATENT DOCUMENTS

| | | |
|---|---|---|
| JP | 2011-512677 A | 4/2011 |
| JP | 2012-059943 A | 3/2012 |
| WO | 2009/102651 A2 | 8/2009 |

*Primary Examiner* — Vincent Wall
(74) *Attorney, Agent, or Firm* — McDermott Will & Emery LLP

(57) ABSTRACT

In a deep trench DTC reaching a predetermined depth from a first main surface of a semiconductor substrate SUB, a plurality of columnar conductors CCB including plugs PUG and field plates FP are formed. A p type impurity layer PIL is formed along the side wall surface of the deep trench DTC. Between the bottom of the plug PUG and the bottom of the p type impurity layer PIL, the field plate FP and the p type impurity layer PIL are positioned to face each other via an insulating film FIF interposed therebetween. Between the bottom of the p type impurity layer PIL and the bottom of the field plate FP, the field plate FP and an n-type drift layer NDL of the semiconductor substrate SUB are positioned to face each other via the insulating film FIF interposed therebetween.

6 Claims, 38 Drawing Sheets

(56) References Cited

U.S. PATENT DOCUMENTS

| | | | |
|---|---|---|---|
| 2002/0117711 A1* | 8/2002 | Yoneda | H01L 29/7813 257/330 |
| 2006/0054970 A1* | 3/2006 | Yanagida | H01L 29/66734 257/330 |
| 2009/0140327 A1* | 6/2009 | Hirao | H01L 29/66727 257/328 |
| 2009/0194772 A1* | 8/2009 | Stum | H01L 29/1095 257/77 |
| 2010/0078708 A1* | 4/2010 | Willmeroth | H01L 29/7802 257/328 |
| 2012/0061753 A1* | 3/2012 | Nishiwaki | H01L 29/407 257/331 |
| 2012/0098057 A1* | 4/2012 | Kim | H01L 29/1095 257/330 |
| 2013/0168764 A1* | 7/2013 | Hsieh | H01L 29/41741 257/331 |
| 2017/0040423 A1* | 2/2017 | Inoue | H01L 29/06 |
| 2017/0069727 A1* | 3/2017 | Blanchard | H01L 29/0623 |
| 2017/0077289 A1* | 3/2017 | Kono | H01L 29/7813 |
| 2018/0076316 A1* | 3/2018 | Kinoshita | H01L 29/1608 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2019-070450 filed on Apr. 2, 2019 including the specification, drawings and abstract is incorporated herein by reference in its entirety.

BACKGROUND OF THE INVENTION

The present invention relates to a semiconductor device and its manufacturing method, and the present invention can be suitably used, for example, in a semiconductor device having a field plate structure and a super junction structure.

In the semiconductor device of a power system, a field-plate structure is used as a structure for obtaining a low conduction resistance (on-resistance) and a high withstand voltage. Patent Documents 1 and 2 disclose, for example, a semiconductor device having a field-plate structure.

In the semiconductor device of the power system, in order to lower the on-resistance, the impurity concentration of the drift layer (e.g., the n-type drift layer) needs to be increased. However, when the impurity concentration of the drift layer is increased, there is a problem that the breakdown voltage is lowered. In the semiconductor device of the field plate structure, the electric field strength is increased, and the breakdown voltage of the drift layer can be improved without increasing the impurity concentration of the drift layer.

There are disclosed techniques listed below.
[Patent Document 1] Japanese Unexamined Patent Application Publication No. 2012-059943
[Patent Document 2] Japanese Patent Publication No. 2011-512677A

SUMMARY OF THE INVENTION

In the semiconductor device of a power system, further high withstand voltage and low on-resistance are required. Other objects and novel features will become apparent from the description of this specification and the accompanying drawings.

Means of Solving the Problems

The semiconductor device according to one embodiment includes a semiconductor substrate of a first conductivity type, a first electrode, a second electrode, a plurality of columnar conductors, a first impurity region of a second conductivity type, a second impurity region of a second conductivity type, a third impurity region of a first conductivity type, and a gate electrode. The semiconductor substrate has a first main surface and a second main surface, and a first electrode is formed on a side of the first main surface, and a second electrode is formed on a side of the second main surface. The plurality of columnar conductors are electrically connected to the first electrode, and are formed from the first main surface of the semiconductor substrate to a first depth. The first impurity regions of the second conductivity type are formed for each of the plurality of columnar conductors over a second depth shallower than the first depth from the first main surface of the semiconductor substrate in a manner surrounding the columnar conductors, and are electrically connected to the first electrode. The second impurity regions of the second conductivity type are formed from the first main surface of the semiconductor substrate to a third depth shallower than the second depth, and are electrically connected to the first electrodes. The third impurity region of the first conductivity type is formed from the side of the first main surface of the second impurity region to a fourth depth shallower than the third depth, and is electrically connected to the first electrode. The gate electrode is formed via a gate dielectric film in a gate trench reaching a portion of the semiconductor substrate of the first conductivity type from the first main surface in such a manner as to penetrate the third impurity regions and the second impurity regions. The first impurity regions are in contact with portions of the semiconductor substrate of the first conductivity type and the second impurity regions, respectively. Each of the plurality of columnar conductors includes a field plate that is formed from a fifth depth to the first depth shallower than the second depth in view from the first main surface of the semiconductor substrate and is formed in the semiconductor substrate of the first conductivity type via an insulating film. Between the fifth depth and the second depth, the field plate and the first impurity region face each other with the insulating film interposed therebetween. Between the second depth and the first depth, the field plate and the semiconductor substrate of the first conductivity type face each other with the insulating film interposed therebetween.

A method of manufacturing the semiconductor device according to another embodiment comprises the following steps. A semiconductor substrate of a first conductivity type having a first main surface and a second main surface is prepared. A gate trench having a predetermined depth is formed in the first main surface of the semiconductor substrate, and a gate electrode is formed by interposing a gate dielectric film in the gate trench. A deep trench having a first depth deeper than the gate trench is formed on the first main surface of the semiconductor substrate at a distance from the gate electrode. Impurities of the second conductivity type are implanted into sidewall surfaces of the deep trench to form first impurity regions of the second conductivity type from the first main surface of the semiconductor substrate over a second depth shallower than the first depth. So as to fill the inside of the deep trench, a conductive film is formed to fill the deep trench via an insulating film covering the side wall surfaces of the deep trench. A second impurity region of the second conductivity type is formed from the first main surface of the semiconductor substrate to a third depth shallower than the bottom of the gate trench in a manner in contact with the first impurity region. A third impurity region of the first conductivity type is formed from the side of the first main surface of the second impurity region to a fourth depth shallower than the third depth in a manner reaching the sidewall surface of the deep trench. So as to expose the third impurity region and the first impurity region, a portion of the insulating film and a portion of the conductive film located from the side of the first main surface in the deep trench over a fifth depth shallower than the second depth and deeper than the third depth are removed, and the remaining portion of the conductive film is formed as a field plate. A plug reaching the fifth depth and in contact with the field plate and in contact with the third impurity region and the first impurity region is formed in the deep trench. A first electrode electrically connected to the plug is formed on the first main surface of the semiconductor substrate. A second electrode is formed on the second main surface of the semiconductor substrate.

According to the one embodiment, both high withstand voltage and low on-resistance of the semiconductor device can be achieved.

According to the another embodiment, a semiconductor device capable of achieving both high withstand voltage and low on-resistance can be manufactured.

DETAILED DESCRIPTION OF THE PREFERRED EMBODIMENTS

Embodiment 1

Figure 1:
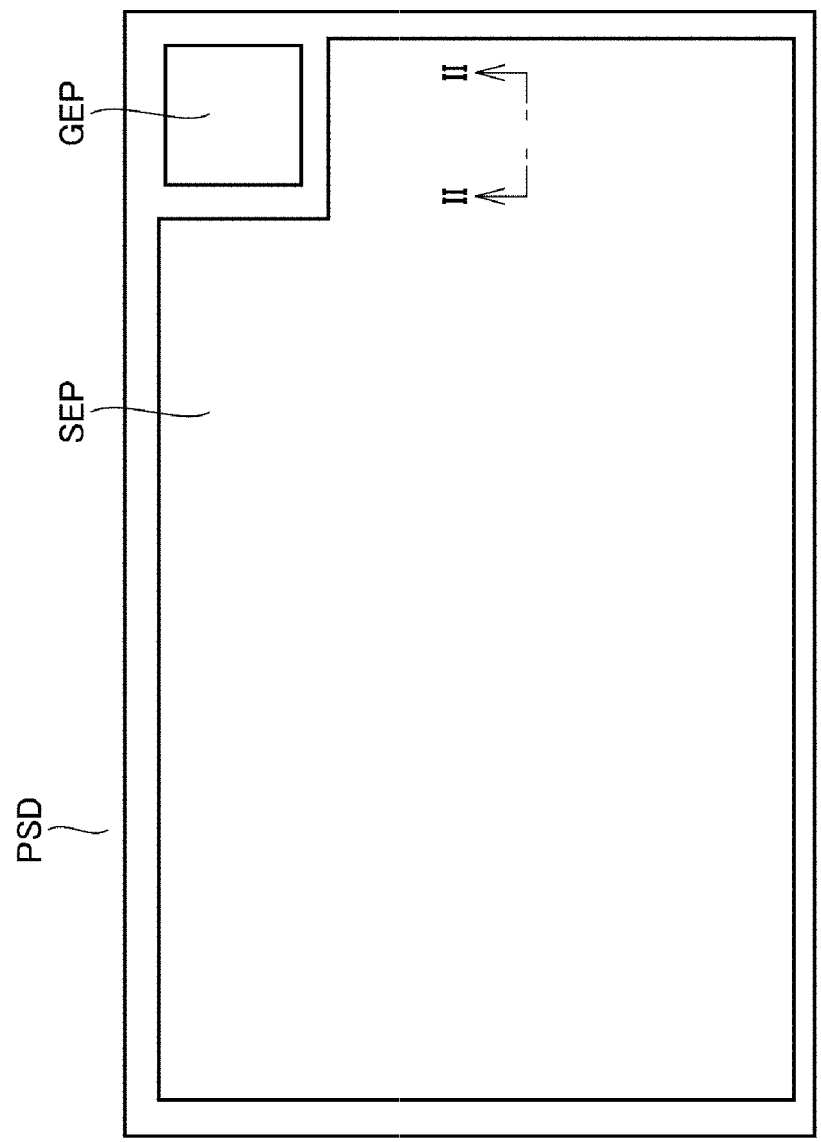
FIG. 1 is a plan view example of a planar pattern of a semiconductor device according to each of embodiments.

An example of a semiconductor device according to the first embodiment will be described. The planar structures of semiconductor device PSD will be described. As shown in FIG. 1, in the semiconductor device PSD, a gate electrode pad GEP and a source electrode pad SEP are formed on the first main surface of the semiconductor substrate SUB. The drain electrode pad DEP is formed on the other main surface (second main surface) of the semiconductor substrate SUB (see FIG. 2).

Figure 2:
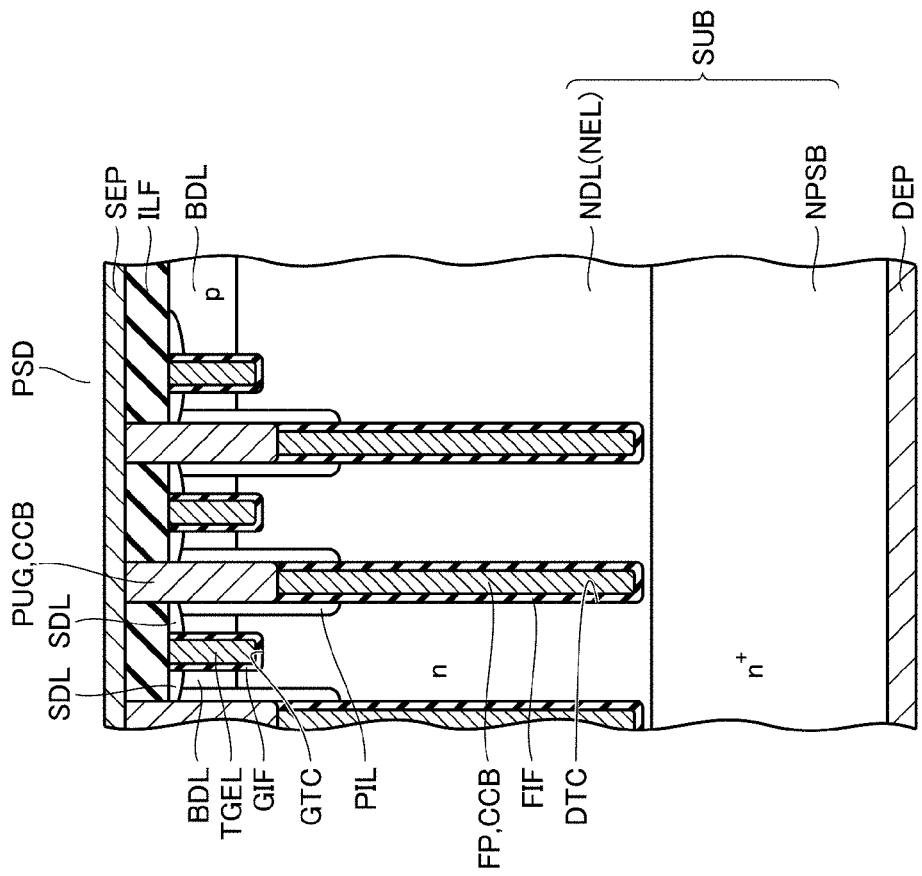
FIG. 2 is a cross-sectional view of a semiconductor device according to a first embodiment in a cross-sectional line II-II shown in FIG. 1.
Figure 3:
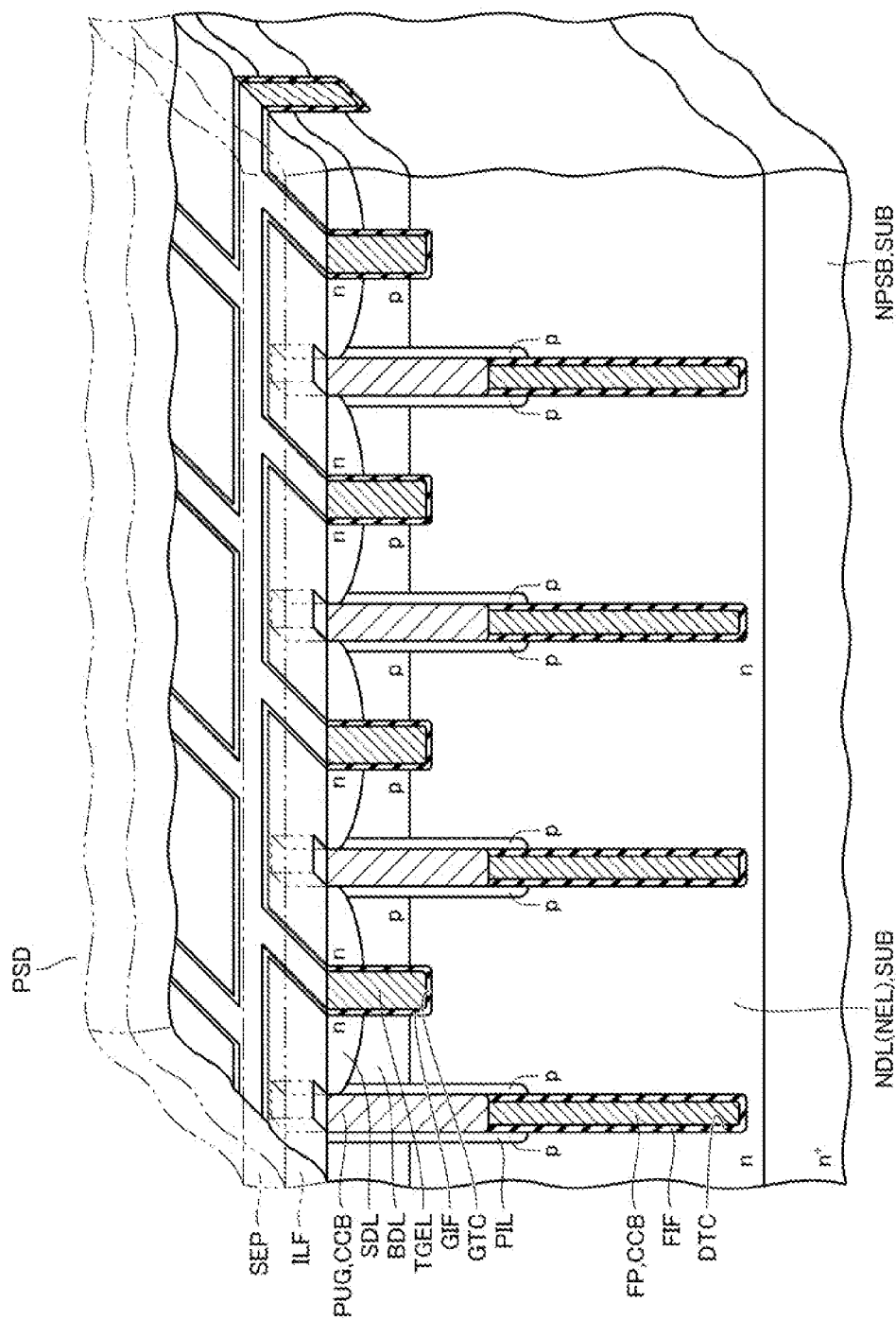
FIG. 3 is a cross-sectional perspective view of a semiconductor device of the first embodiment corresponding to the cross-sectional line II-II shown in FIG. 1.

The planar structure and the cross-sectional structure of the semiconductor device PSD will be described in more detail. As shown in FIGS. 2 and 3, the semiconductor substrate SUB includes n+ type substrate NPSB and n type epitaxial layer NEL. The n type epitaxial layer NEL becomes an n-type drift layer NDL. A plurality of columnar conductors CCB are formed from the first main surface of the semiconductor substrate SUB to a predetermined depth in the n type epitaxial layer NEL.

Each of the plurality of columnar conductors CCB is formed in the deep trench DTC. Each of the plurality of columnar conductors CCB includes a plug PUG of tungsten and a field plate FP. An insulating film FIF is interposed between the field plate FP and the semiconductor substrate SUB.

For each of the plurality of columnar conductors CCB, p type impurity layers PIL (first impurity regions) are formed at a predetermined depth (second depth) from the first main surface of the semiconductor substrate SUB in a manner surrounding the columnar conductors CCB in plan view. The p type impurity layer PIL is formed from the side wall surface of the deep trench DTC toward the side of the n type epitaxial layer NEL or the like. The p type impurity layer PIL is electrically connected to the source electrode pad SEP via the plug PUG.

The p type base diffusion layer BDL (second impurity region) is formed at a predetermined depth (third depth) from the first main surface of the semiconductor substrate SUB. An n+ type source diffusion layer SDL (third impurity region) is formed from the surface of the p type base diffusion layer BDL to a predetermined depth (fourth depth) shallower than the bottom of the p type base diffusion layer BDL.

Gate trenches GTC reaching the portions of the n type epitaxial layer NEL from the first main surface of the semiconductor substrate SUB are formed so as to penetrate the n+ type source diffusion layer SDL and the p type base diffusion layer BDL. Gate electrodes TGEL are formed in the gate trenches GTC with gate dielectric film GIF interposed therebetween. The gate electrode TGEL, the n+ type source-diffusion layer SDL, and the n-type drift layer NDL constitute a MOS (Metal Oxide Semiconductor) type field-effect transistor.

An interlayer insulating film ILF is formed to cover the first main surface of the semiconductor substrate SUB. A source electrode pad SEP is formed so as to be in contact with the interlayer insulating film ILF. Each of the plurality of columnar conductors CCB is electrically connected to the source electrode pad SEP via the plug PUG. Each of the n+ type source diffusion layer SDL and the p type impurity layer PIL is formed so as to be in contact with the plug PUG. As a shape (pattern) of the pillar conductor CCB including the p type impurity layer PIL in plan view, for example, a square shape is set.

In the semiconductor device PSD described above, the p type impurity layers PILs are formed at a predetermined depth from the first main surface of the semiconductor substrate SUB. Between the bottom (fifth depth) of the plug PUG and the bottom (second depth) of the p type impurity layer PIL, the field plate FP and the p type impurity layer PIL are positioned with the insulating film FIF interposed therebetween. This structure is referred to as a semi-super junction structure.

The field plate FP is formed from the bottom (fifth depth) of the plug PUG shallower than the bottom (second depth) of the p type impurity layer PIL to the bottom (first depth) of the deep trench DTC. Between the bottom (second depth) of the p type impurity layer PIL and the bottom (first depth) of the field plate FP, the field plate FP and the n-type drift layer NDL of the semiconductor substrate SUB are located with the insulating film FIF interposed therebetween. This structure is referred to as a field plate structure.

The field plate FP is electrically connected to the source electrode pad SEP via the plug PUG. The n+ type source diffusion layer SDL and the p type impurity layer PIL are electrically connected to the source electrode pad SEP via the plug PUG.

Figure 4:
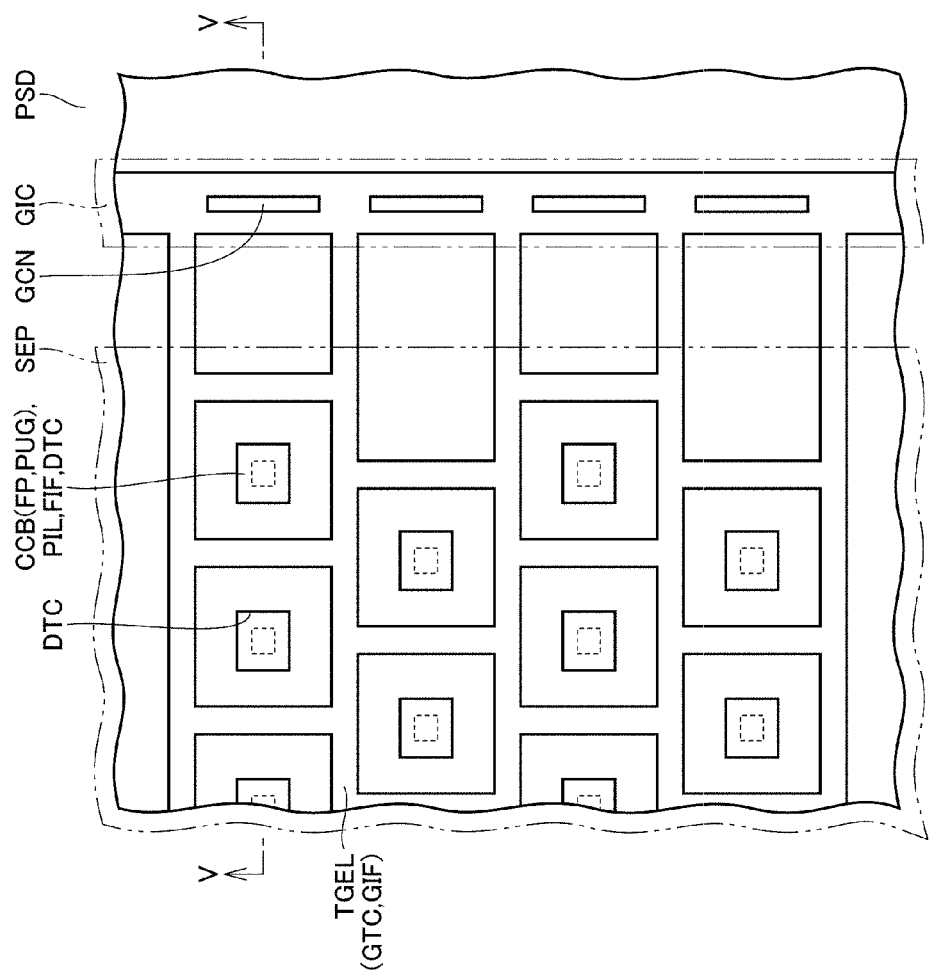
FIG. 4 is a partially enlarged plan view showing an example of a plane pattern of a semiconductor device in the first embodiment.
Figure 5:
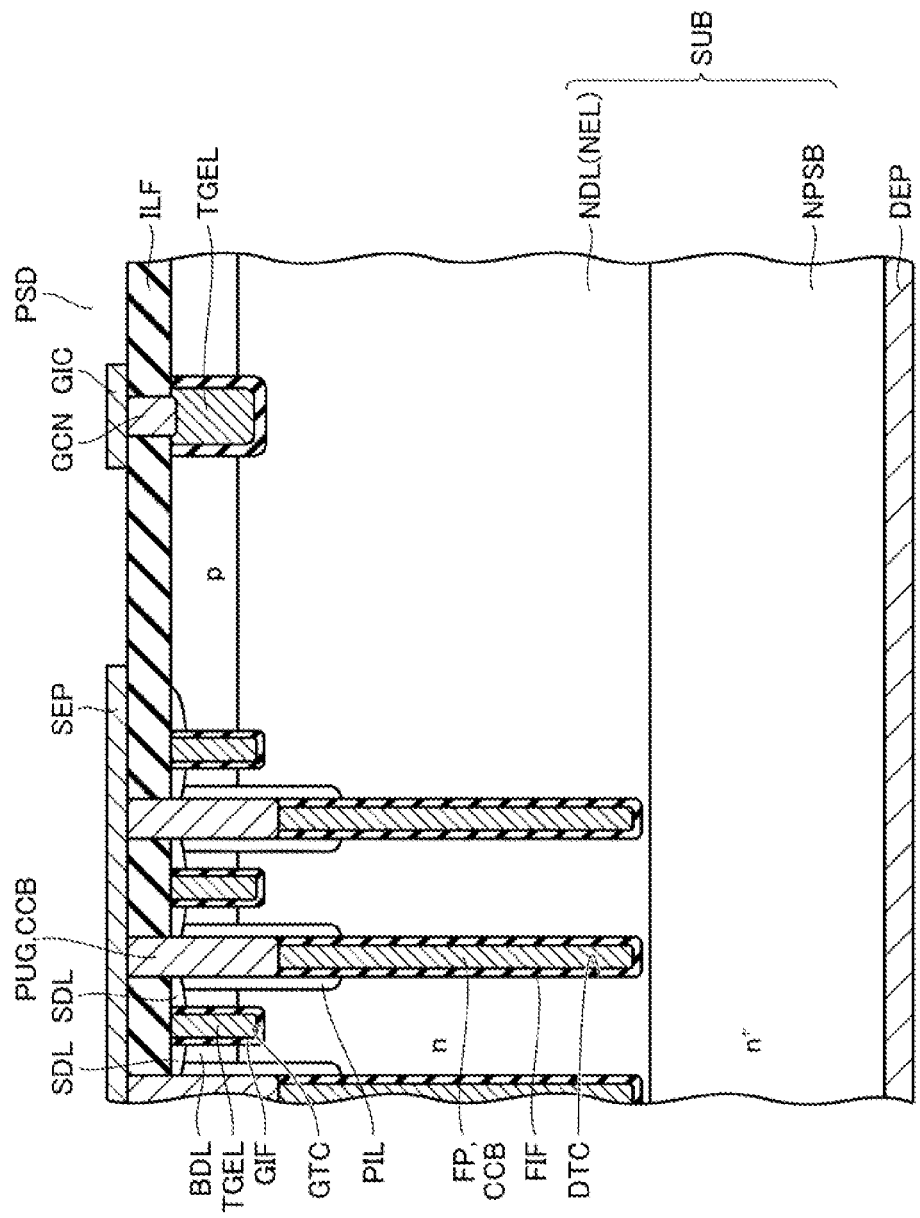
FIG. 5 is a portion cross-sectional view of a semiconductor device in the first embodiment at a cross-sectional line V-V shown in FIG. 4.

The gate electrode TGEL is electrically connected to the gate electrode pad GEP (see FIG. 1) through the gate wiring GIC (see FIG. 4). As shown in FIGS. 4 and 5, the gate trench GTC in which the gate electrodes TGEL are formed includes a portion extending in one direction and a portion extending in another direction intersecting with the one direction. In a predetermined area on the first main surface of the semiconductor substrate SUB, the gate electrodes TGEL are electrically connected to the gate wiring GIC via the gate contacts GCN. The gate wiring GIC is connected to the gate electrode pad GEP (see FIG. 1).

Figure 6:
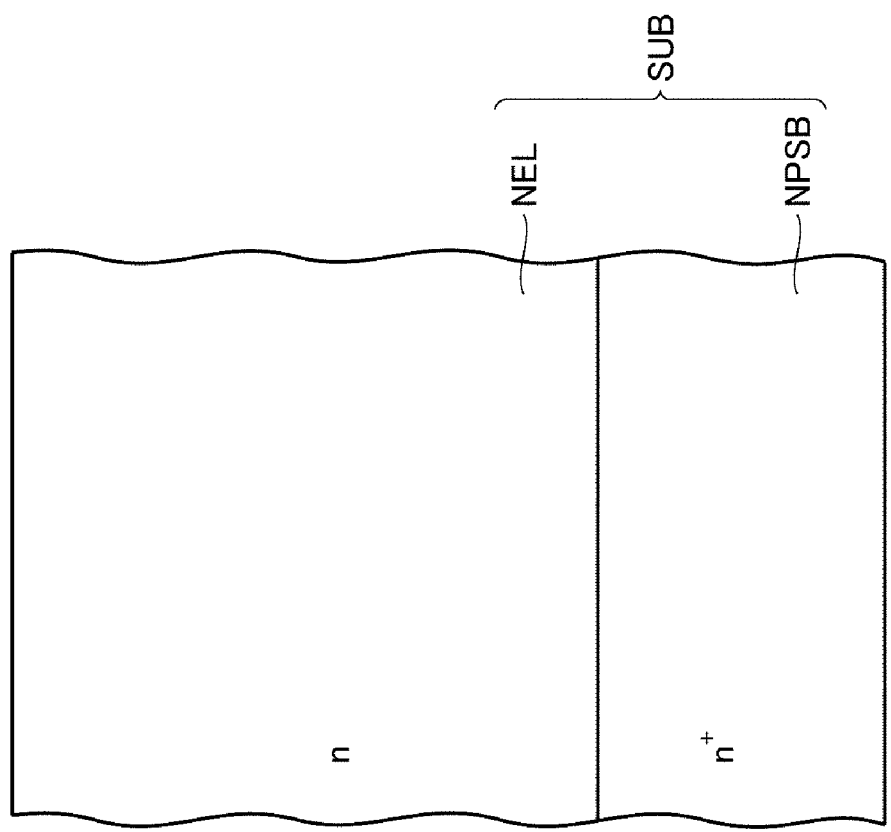
FIG. 6 is a cross-sectional view showing one step of manufacturing method of a semiconductor device in the first embodiment.

Next, an exemplary manufacturing method of the above-described semiconductor device will be described. First, as shown in FIG. 6, n-type epitaxial layers NELs are formed on the surfaces of n+ type substrate NPSBs by epitaxial growth. The n+ type substrate NPSBs and the n-type epitaxial layers NELs form the semiconductor substrate SUB.

Next, predetermined photolithography and etch processes are performed on the semiconductor substrate SUB to form gate trenches (not shown). Next, thermal acid treatment is performed to form a thermal oxide film (not shown) serving as a gate dielectric film. Next, for example, a polysilicon film (not shown) is formed so as to fill the gate trench.

Figure 7:
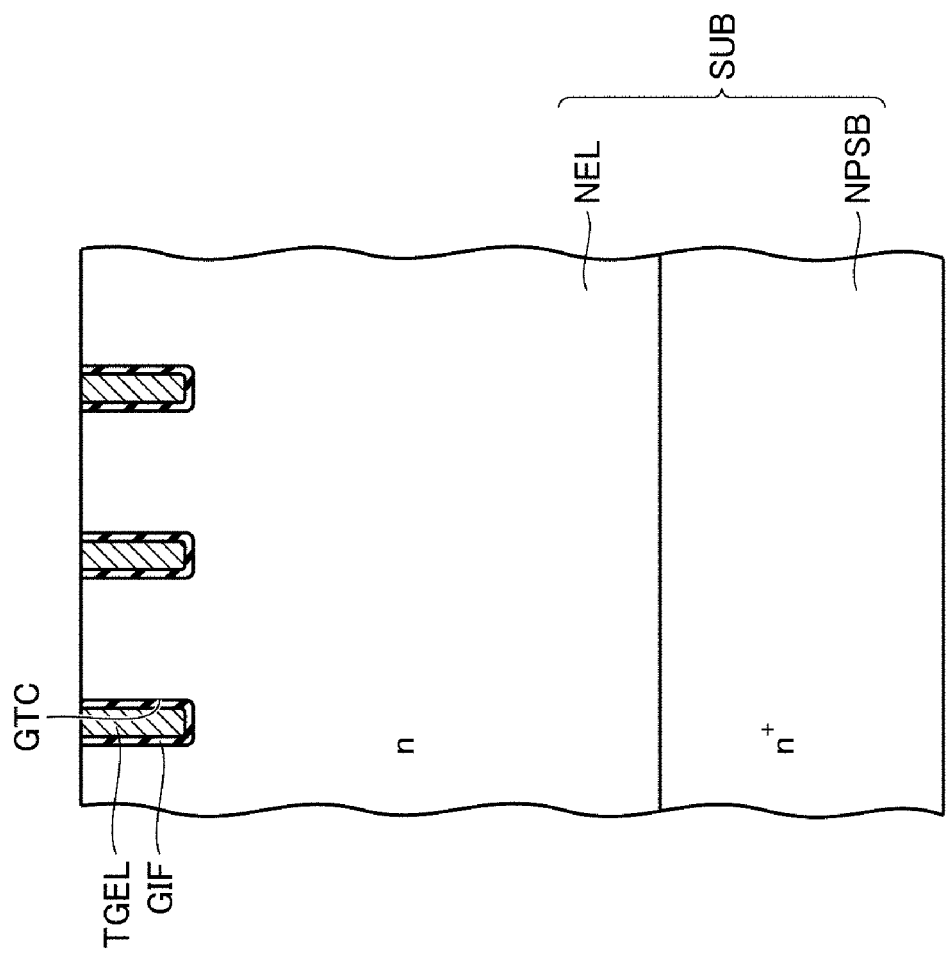
FIG. 7 is a cross-sectional view showing a step performed after the process shown in FIG. 6.

Next, an etching back process is performed. As a result, as shown in FIG. 7, the portions of the polysilicon film and the thermal oxide film located on the upper surface of the semiconductor substrate SUB are removed, and the gate electrodes TGEL are formed in the gate trenches GTCs with the gate dielectric film GIFs interposed therebetween. Note that a chemical mechanical polishing process may be performed instead of the etching back process.

Next, a protective film IPF (see FIG. 8) for forming a deep trench is formed to cover the semiconductor substrate SUB. As the protective film, for example, a laminated film of a silicon nitride film and a silicon oxide film is formed. At this time, the silicon nitride film is a lower layer film. Next, photolithography is performed to form a photoresist pattern (not shown) corresponding to the pattern of the deep trench.

Figure 8:
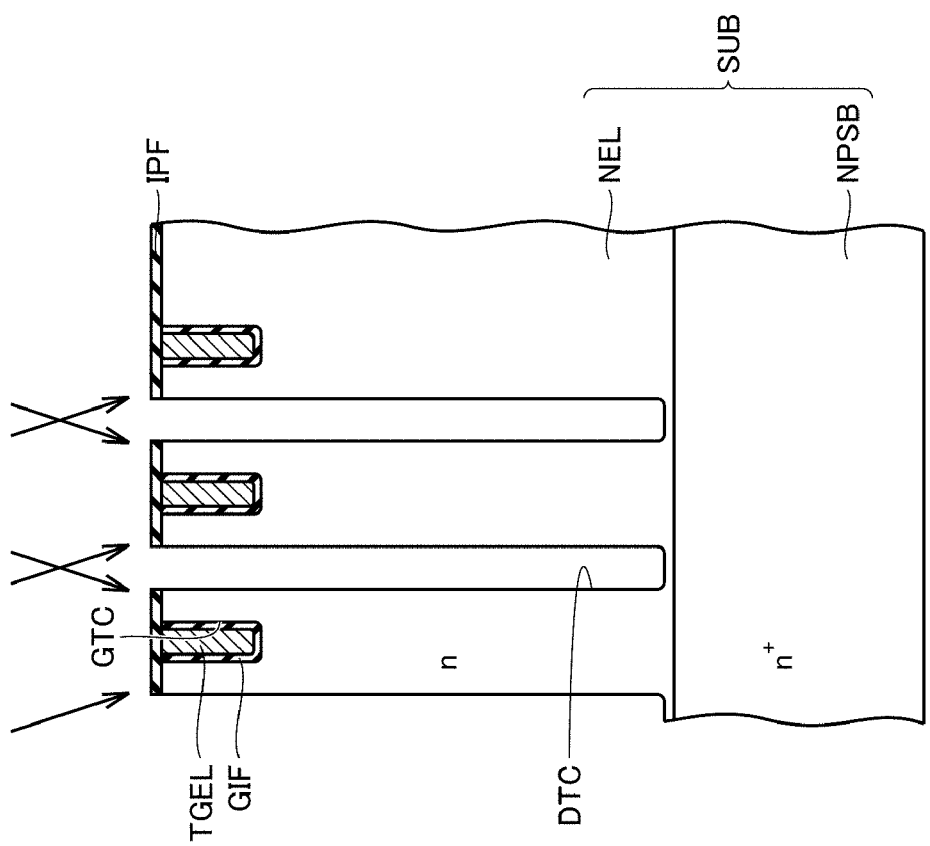
FIG. 8 is a cross-sectional view showing a step performed after the process shown in FIG. 7.

Next, using the photoresist pattern as an etching mask, the semiconductor substrate SUBs (n-type epitaxial layers NEL) are etched. The photoresist pattern is then removed. As a result, as shown in FIG. 8, a deep trench DTC is formed.

Figure 9:
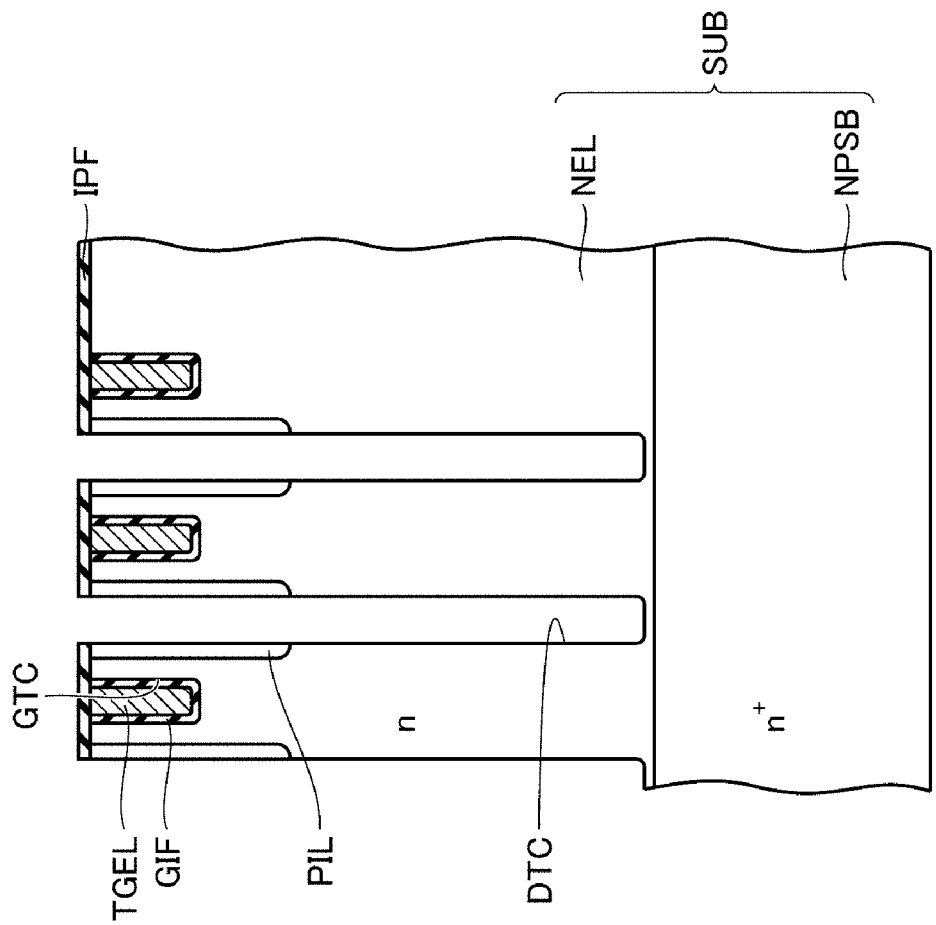
FIG. 9 is a cross-sectional view showing a step performed after the process shown in FIG. 8.

Next, a p type impurity is implanted into the sidewall surface of the deep trench DTC by oblique ion implantation using the protective film IPF as an implantation mask. As a result, as shown in FIG. 9, a p type impurity layer PIL is formed on the sidewall surface of the deep trench DTC. The p type impurity layer PIL is formed at a predetermined depth (second depth) from the first main surface of the semiconductor substrate SUB (n type epitaxial layer NEL).

Figure 10:
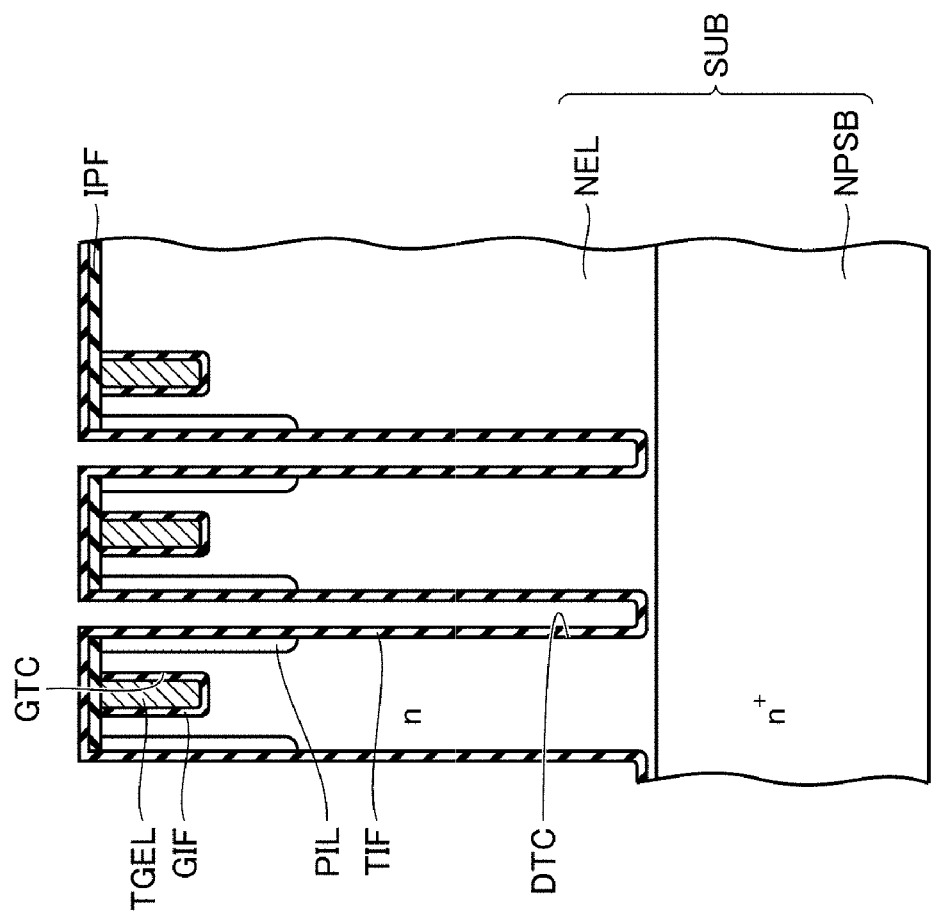
FIG. 10 is a cross-sectional view showing a step performed after the process shown in FIG. 9.

Next, thermal acid treatment is performed to form a thermal oxide film (not shown) on the sidewall surface of the deep trench DTC. Next, an insulating film is formed by, for example, a CVD (Chemical Vapor Deposition) method so as to cover the thermal oxide film and the like. Thus, as shown in FIG. 10, the insulating film TIF is formed so as to cover the first main surface of the semiconductor substrate SUB including the sidewall surface of the deep trench DTC.

Figure 11:
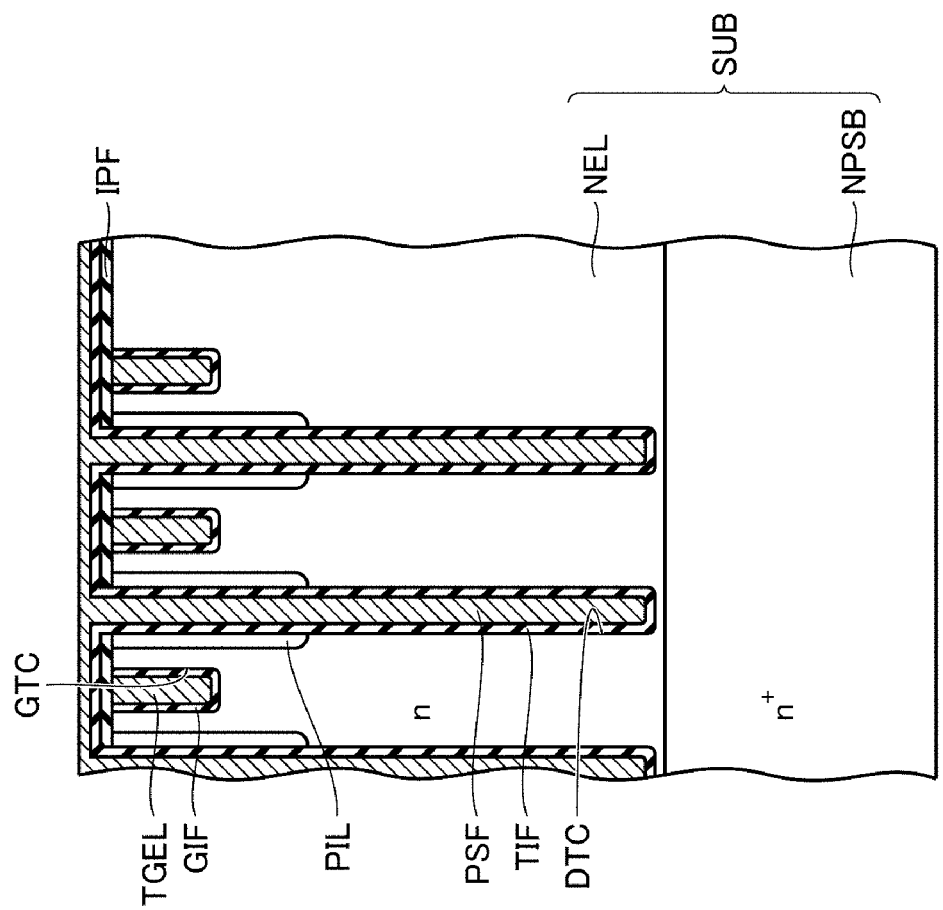
FIG. 11 is a cross-sectional view showing a step performed after the process shown in FIG. 10.

Next, as shown in FIG. 11, the polysilicon film PSF is formed so as to cover the first main surface of the semiconductor substrate SUB in a manner of filling the deep trench DTC. Next, a chemical mechanical polishing process is performed to remove a portion of the polysilicon film PSF, a portion of the insulating film TIF, and the protective film IPF located on the upper surface of the semiconductor substrate SUB.

Figure 12:
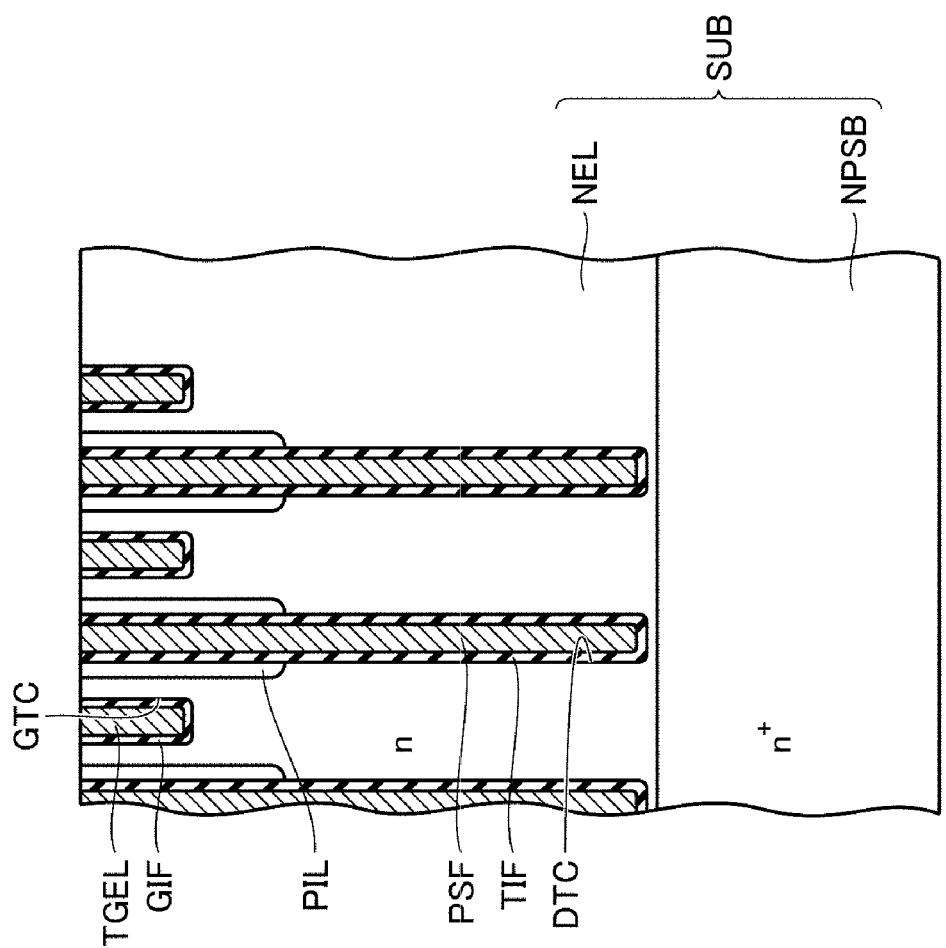
FIG. 12 is a cross-sectional view showing a step performed after the process shown in FIG. 11.

At this time, the silicon nitride film of the protective film IPF serves as a stopper of the chemical mechanical polishing process. Next, the silicon nitride film is removed by a wet etching process. Thus, as shown in FIG. 12, the insulating film TIF and the polysilicon film PSF are left in the deep trench DTC, and the surfaces of the semiconductor substrate SUB (n type epitaxial layer NEL) are exposed. Next, a protective film (not shown) is formed on the exposed surfaces of the semiconductor substrate SUB.

Figure 13:
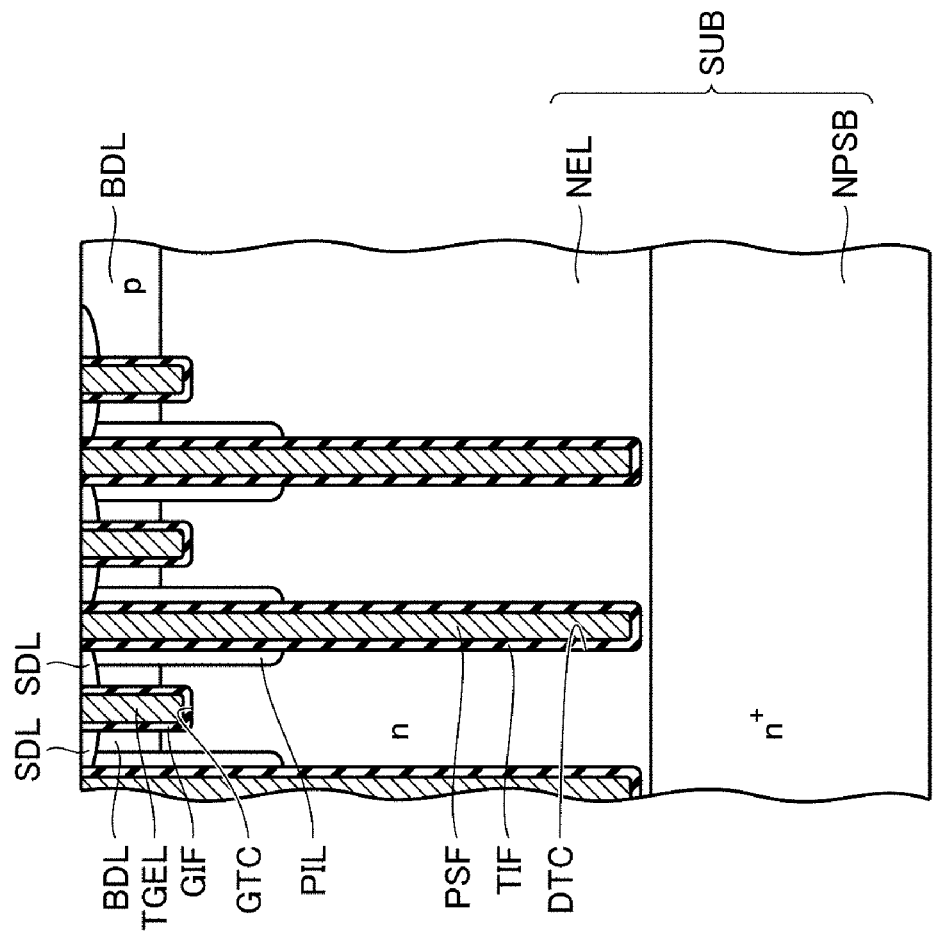
FIG. 13 is a cross-sectional view showing a step performed after the process shown in FIG. 12.

Next, a p type impurity is implanted from the first main surface of the semiconductor substrate SUB. Next, an n type impurity is implanted. As a result, as shown in FIG. 13, the p type base diffusion layer BDL is formed at a predetermined depth (third depth) from the first main surface of the semiconductor substrate SUB. The p type impurity concentration of the p type base diffusion layer BDL is, for example, about $10^{17}$ atoms/cm$^3$. An n+ type source diffusion layer SDL is formed at a predetermined depth from the surface of the p type base diffusion layer BDL.

The n type impurity density of the n+ type source diffusion layer SDL is, for example, about $10^{20}$ atoms/cm$^3$. At this time, a portion of the p type impurity layer PIL located on the first main surface of the semiconductor substrate SUB is replaced with a portion of the n+ type source diffusion layer SDL by implanting an impurity having a higher n type impurity concentration.

Next, an interlayer insulating film ILF such as a silicon oxide film is formed so as to cover the first main surface of the semiconductor substrate SUB. Next, a predetermined photolithography process and an etching process are performed to remove a portion of the polysilicon film PSF and a portion of the insulating film FIF located over a predetermined depth from the first main surface side of the deep trench DTC.

Figure 14:
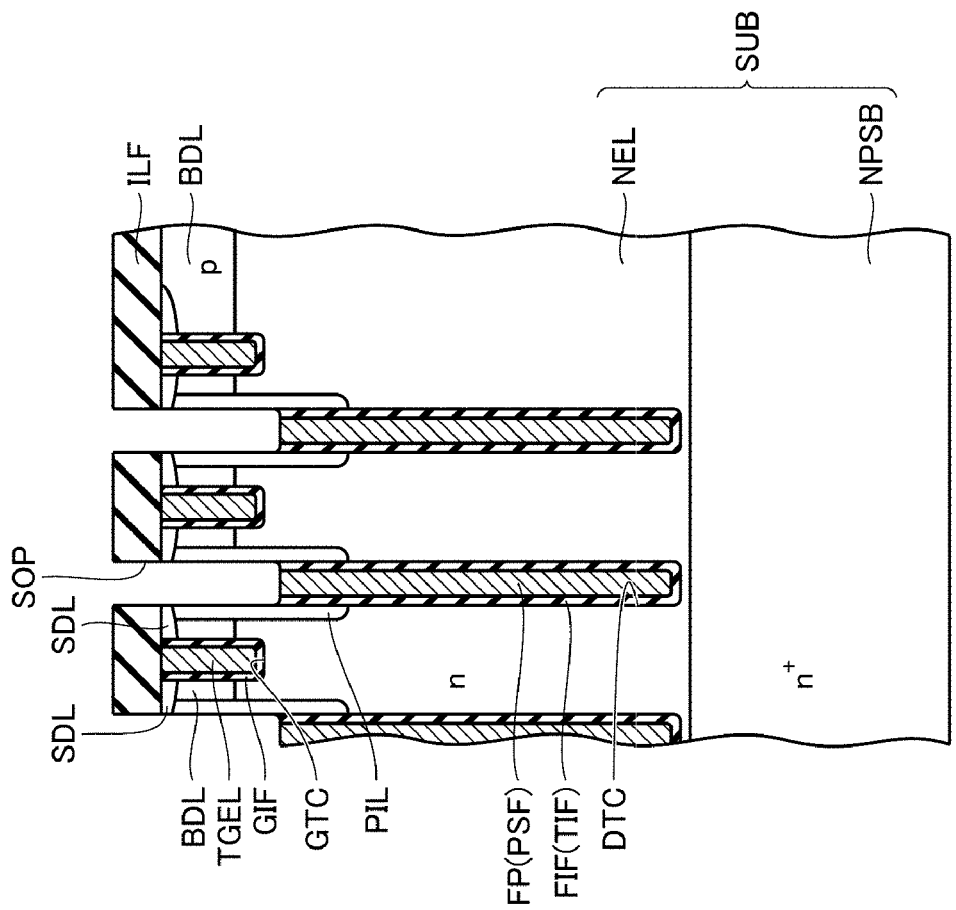
FIG. 14 is a cross-sectional view showing a step performed after the process shown in FIG. 13.

As a result, as shown in FIG. 14, an opening SOP exposing a part of the deep trench DTC is formed. The opening SOP is formed from the side of the first main surface to a position (fifth depth) shallower than the bottom (second depth) of the p type impurity layer PIL and deeper than the bottom (third depth) of the p type base diffusion layer BDL.

Next, for example, a tungsten film (not shown) is formed by, for example, CVD so as to cover the interlayer insulating film ILF in a manner of filling the opening SOP. Next, the tungsten film is subjected to, for example, chemical mechanical polishing to remove a portion of the tungsten film located on the upper surface of the interlayer insulating film ILF while leaving a portion of the tungsten film located in the opening SOP.

Figure 15:
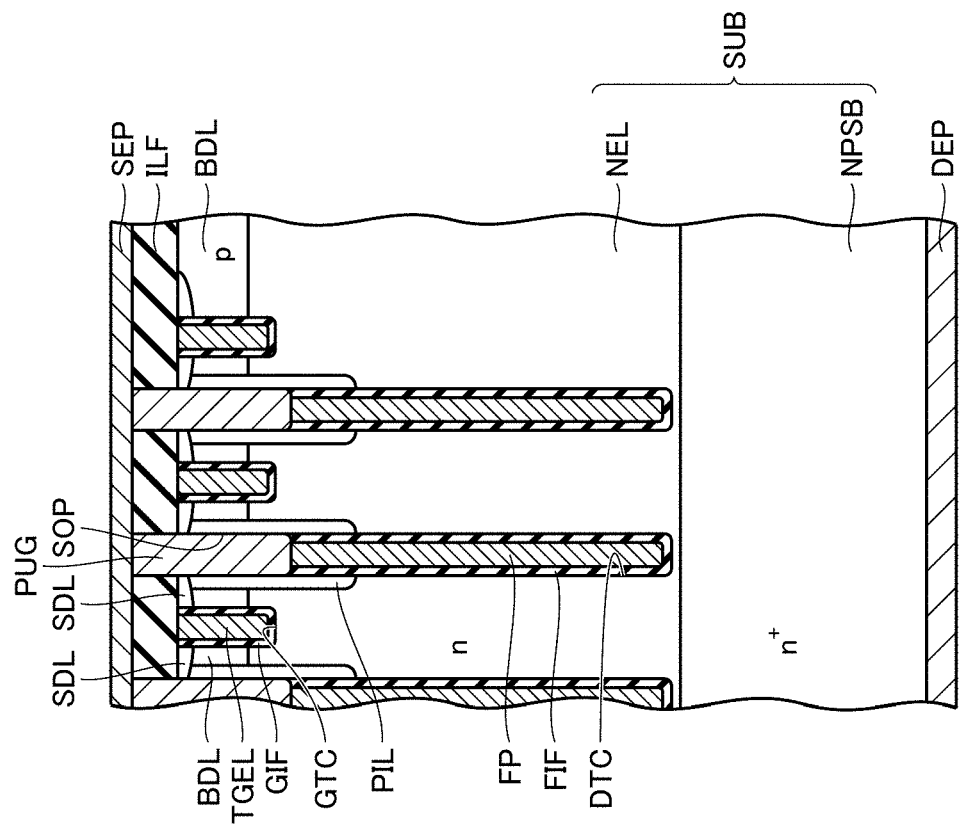
FIG. 15 is a cross-sectional view showing a step performed after the process shown in FIG. 14.

As a result, as shown in FIG. 15, a plug PUG of tungsten is formed in the deep trench DTC. The portion of the polysilicon film left under the plug PUG serves as a field plate FP. The plug PUG comes into contact with each of the n+ type source diffusion layer SDL, the p type impurity layer PIL, and the field plate FP.

Next, an aluminum film (not shown) is formed by, e.g., sputtering so as to cover the interlayer insulating film ILF and the like. Next, predetermined photolithography processing and etching processing are performed. As a result, as shown in FIG. 15, the source electrode pad SEP is formed. At the same time as the source electrode pad SEP, a gate wiring GIC and a gate electrode pad GEP are formed. Thereafter, the drain electrode pad DEP is formed so as to cover the second main surface of the semiconductor substrate SUB. Thus, the main parts of the semiconductor device PSDs are completed.

In the semiconductor device PSDs described above, first, the field plate structures are provided. As a result, high withstand voltage and low on-resistance of the semiconductor device PSD can be achieved. The semiconductor device PSD described above have a semi-super junction structure in addition to the field plate structure. As a result, the withstand voltage can be further improved. The evaluation by the simulation performed by the inventors and the result will be described.

First, the initial condition (initial state) of the simulation will be described. In the simulation, a region including a MOS field effect transistor between an insulating film in one deep trench and an insulating film in the other deep trench of adjacent deep trenches was set.

Figure 16:
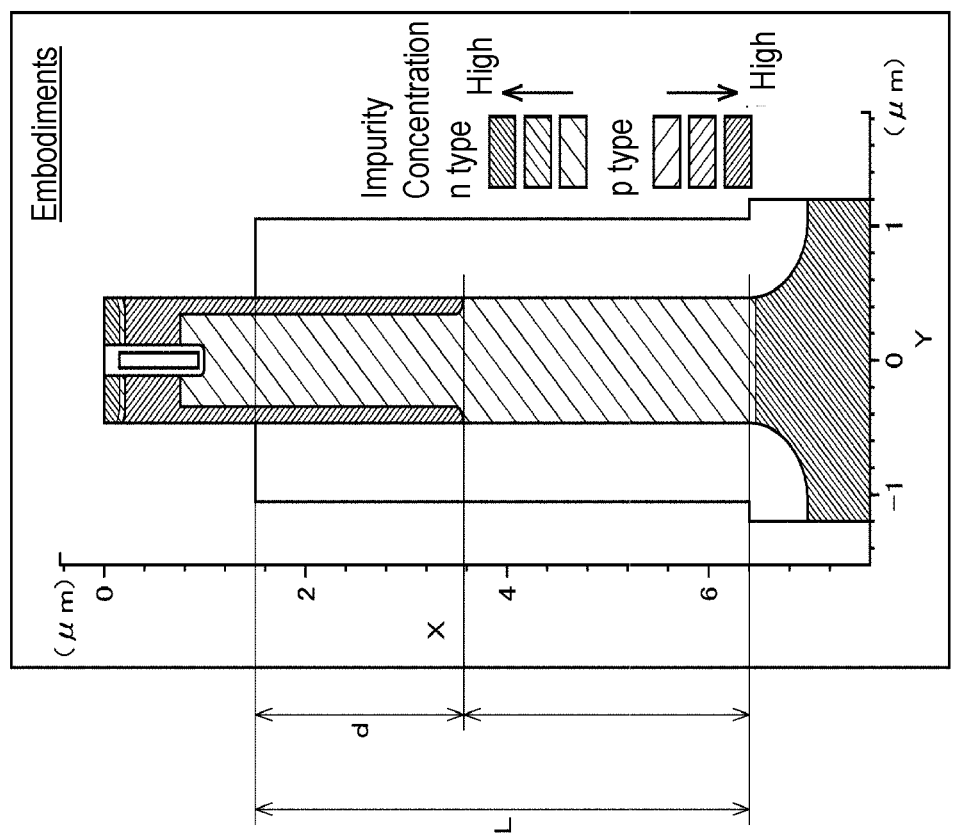
FIG. 16 is a portion cross-sectional view showing an initialization state for explaining a simulation-based evaluation of the semiconductor device related to the first embodiment.

FIG. 16 shows, as an embodiment, an initialization of the above-mentioned semiconductor device. As shown in FIG. 16, in the semiconductor device according to the embodiment, a semi-super junction structure including p type impurity layers and a field-plate structure are set. In FIG. 16, the relationship between the height of the n-type impurity concentration and the height of the p type impurity concentration is schematically shown by the direction of hatching and the density of hatching.

Figure 17:
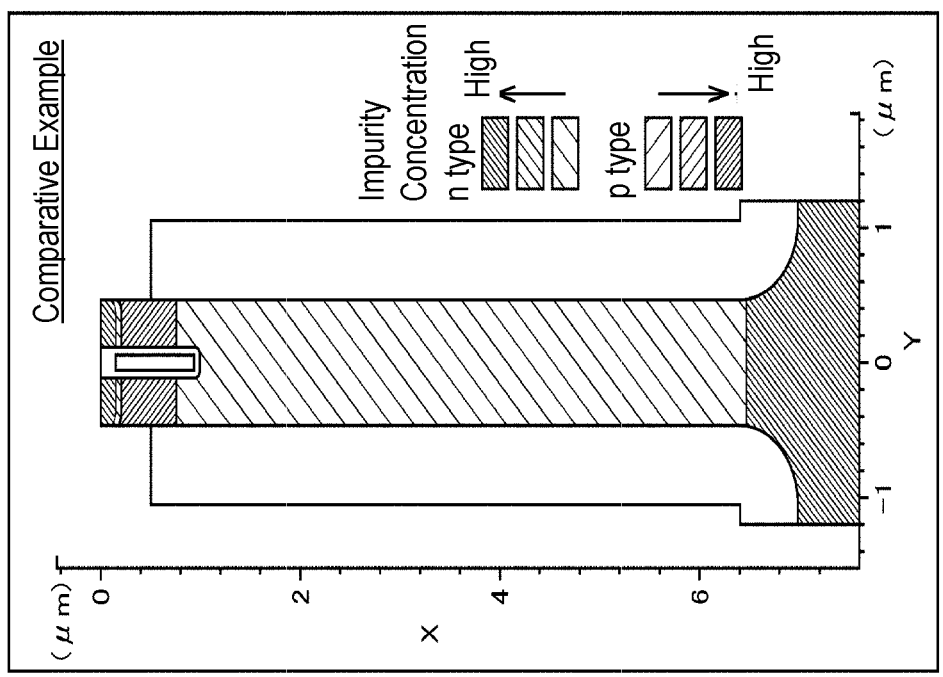
FIG. 17 is a portion cross-sectional view showing an initialization state for explaining a simulation-based evaluation of a semiconductor device according to a comparative example.

Next, FIG. 17 shows an initial state of the semiconductor device according to the comparative example. As shown in FIG. 17, in the semiconductor device according to the comparative examples, the impurity layer corresponding to the p type impurity layer was not set, but only the typical field-plate structures were set. In FIG. 17, the relationship between the height of the n-type impurity concentration and the height of the p type impurity concentration is schematically shown by the direction of hatching and the density of hatching.

Figure 18:
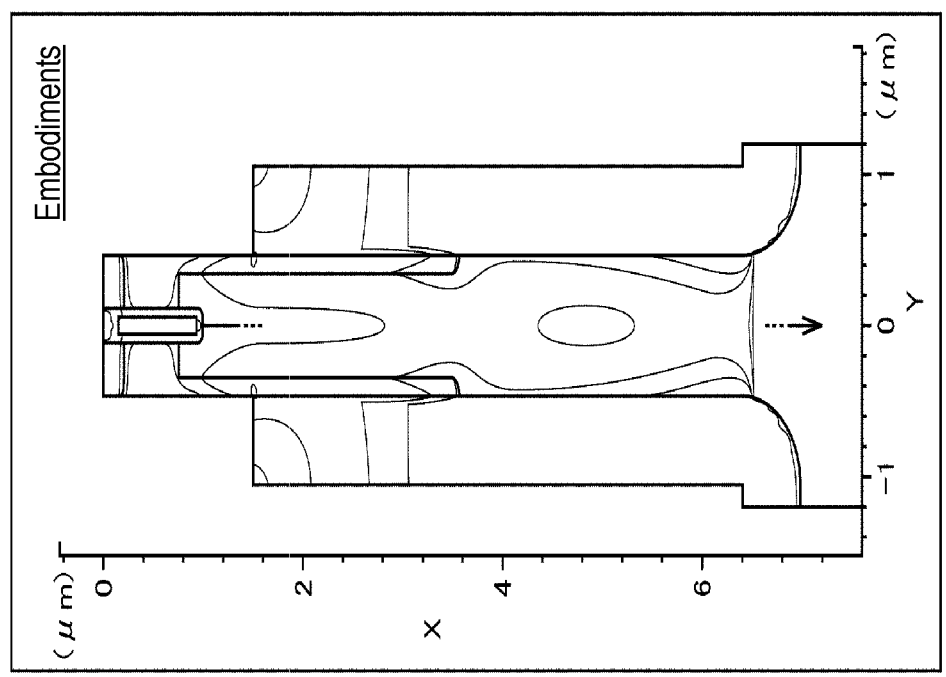
FIG. 18 is a portion cross-sectional view showing distributions of electric field strengths for explaining evaluates by simulations of a semiconductor device relating to the first embodiment.
Figure 19:
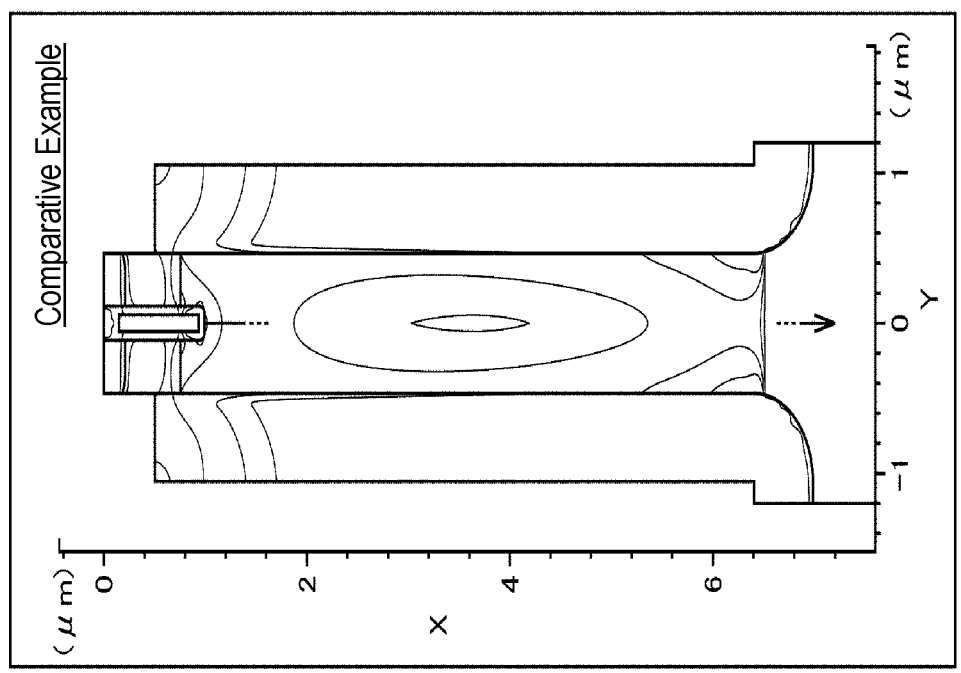
FIG. 19 is a portion cross-sectional view showing distributions of electric field strengths for explaining evaluates by simulations of the semiconductor device according to the comparative example.

Next, the electric field strength distribution when a predetermined voltage for evaluating the withstand voltage is applied to the n+ type source diffusion layer will be described. The electric field strength distribution in the semiconductor device according to the embodiment is shown in FIG. 18, and the electric field strength distribution in the semiconductor device according to the comparative examples is shown in FIG. 19. In each of FIGS. 18 and 19, only the field strength contour lines are shown to avoid complication of the drawings. From the calculated electric field strength distributions, the electric field strength in the depth direction (see the downward arrow) was extracted from the position directly below the gate electrode (gate dielectric film) in the coordinate of Y=0. A graph of the electric field strength is shown in FIG. 20.

Figure 20:
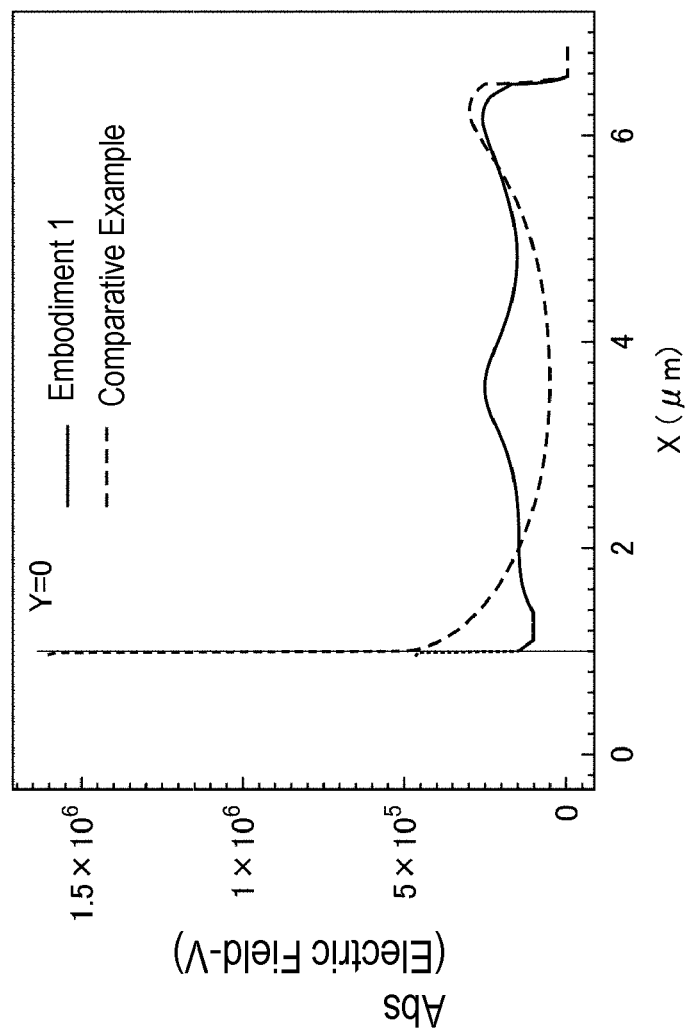
FIG. 20 is a graph showing a relationship between a depth direction of an n-type drift layer and an electric field strength under a gate electrode in the first embodiment.

In FIG. 20, graphs of the electric field strength of the semiconductor device according to the Embodiment are shown by solid lines as Embodiment 1. The graphs of the electric field strength of the semiconductor device according to the comparative example are shown by the dotted line as the comparative example. As shown in FIG. 20, in the semiconductor device according to the Embodiment, since the p type impurity layers are formed, the electric field strength is higher than the electric field strength of the semiconductor device according to the comparative examples when the values of X are approximately 2 µm to 6 µm. The breakdown voltage is calculated as an integral value of the electric field strength in the depth direction. The inventors concluded from the graphs of the electric field strengths that the withstand voltage as a semiconductor device can be improved as compared with the semiconductor device according to the comparative examples.

Figure 21:
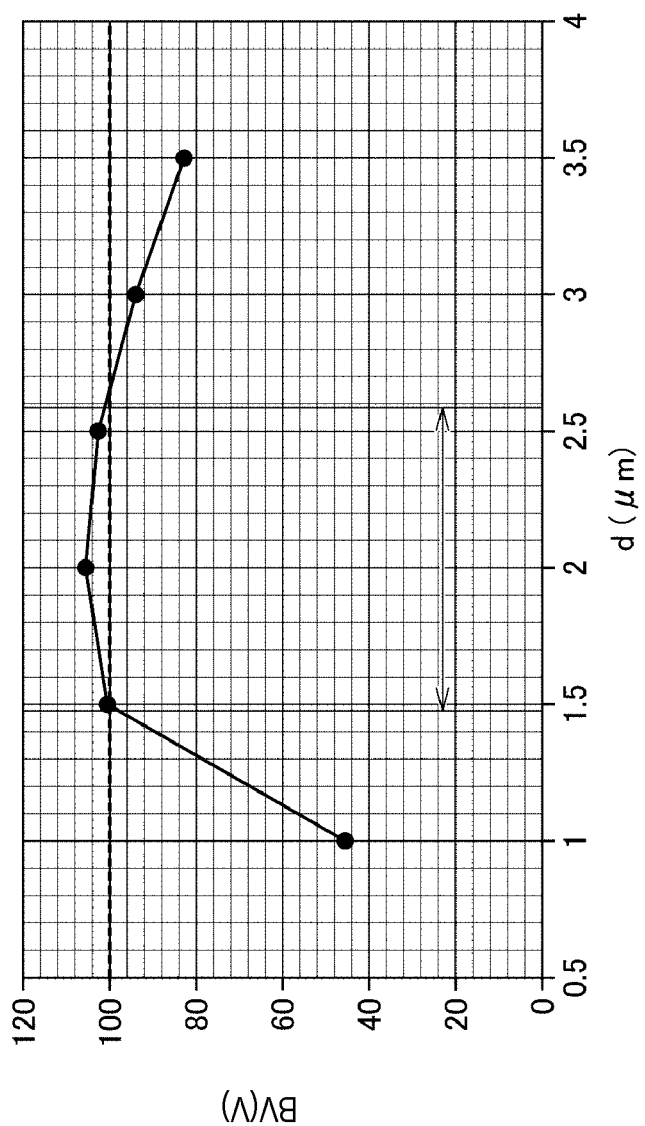
FIG. 21 is a graph showing a relationship between a depth of a p type impurity layer and a breakdown voltage in the first embodiment.

Next, the inventors evaluated the relationship between the depth of the p type impurity layer and the withstand voltage by simulation. The graph is shown in FIG. 21. The horizontal axis represents the length d from the upper end of the insulating film in the deep trench shown in FIG. 16, that is, from the upper end of the field plate to the lower end of the p type impurity layer. The vertical axis represents the breakdown voltage. As shown in FIG. 21, it was found that the withstand voltage was improved by setting the length d from the upper end of the field plate to the lower end of the p type impurity layer to half the length (depth) of the field plate. The half of the length of the field plate is not intended to be exactly half, and includes an error range of ±10% as a manufacturing variation.

It is understood that when the length d from the upper end of the field plate to the lower end of the p type impurity layer is shorter than the length of the field plate, the breakdown voltage rapidly decreases. This is considered to be because, when the length d is shortened, the structure of the semiconductor device is similar to the structure of the semiconductor device according to the comparative example having no p type impurity layers, and therefore, the effect of improving the withstand voltage is reduced.

On the other hand, it is understood that the breakdown voltage gradually decreases as the length d from the upper end of the field plate to the lower end of the p type impurity layer increases. As shown in FIG. 20, in the semiconductor device according to the comparative example, the electric field strength (electric field strength A) in the vicinity of the lower end portion of the field plate is higher than the electric field strength in the vicinity of the center in the depth direction of the field plate. Therefore, when the length d is set to be relatively long, the electric field strength in the vicinity of the lower end portion of the field plate FP differs little from the electric field strength A of the semiconductor device according to the comparative example, and the effect of improving the withstand voltage is small.

That is, in order to improve the breakdown voltage, it has been found that it is desirable to form the p type impurity layers to a predetermined depth so that the electric field strength at a relatively low electric field strength can be increased in the electric field strength distributions of the semiconductor device according to the comparative examples. Here, it has been found that setting the length d to half the length (depth) of the field plate is effective in improving the withstand voltage. As described above, the length d includes an error range of ±10% as a manufacturing variation.

Figure 22:
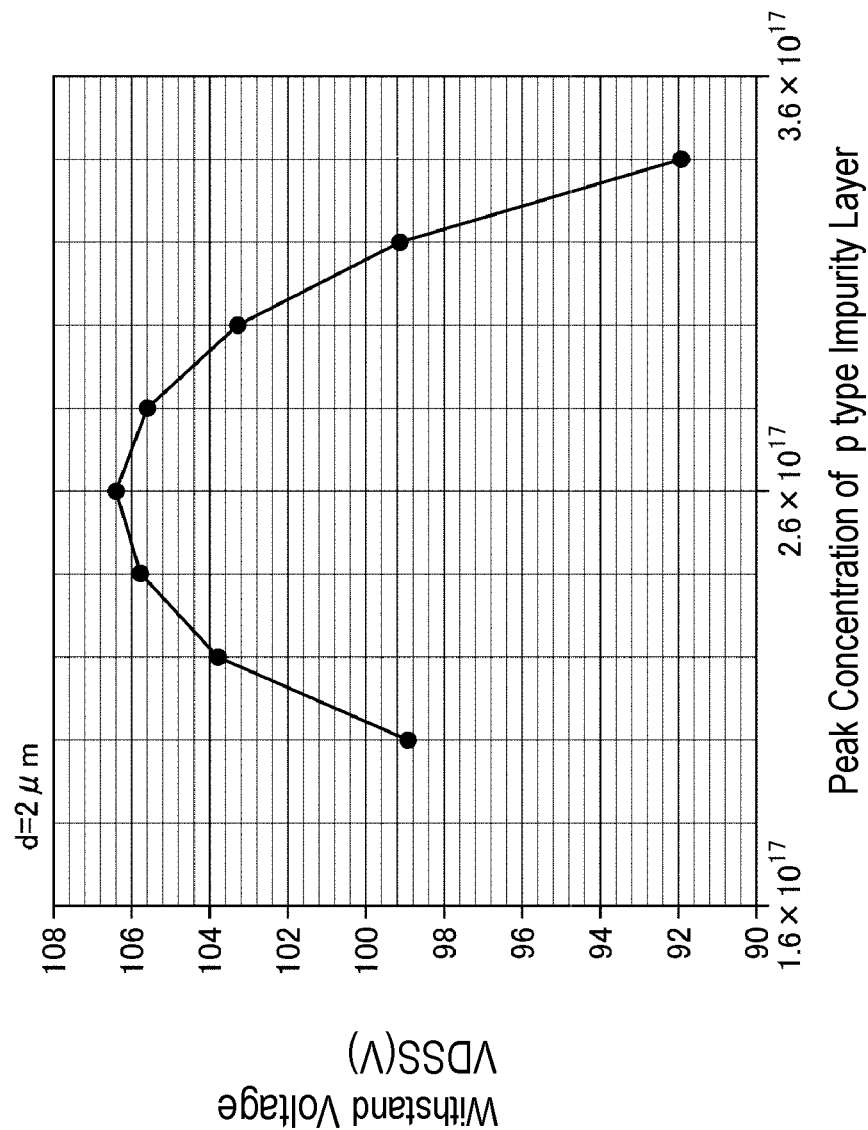
FIG. 22 is a graph showing a relationship between a peak concentration of a p type impurity layer and a breakdown voltage in the first embodiment.

Next, the inventors evaluated the relationship between the impurity concentration of the p type impurity layer and the withstand voltage by simulation. The graph is shown in FIG. 22. The horizontal axis represents the peak concentration of the p type impurity layer. The vertical axis represents the breakdown voltage. The length d (depth) of the p type impurity layer was set to 2 µm. As shown in FIG. 22, it was found that the breakdown voltage became the highest when the impurity concentration of the p type impurity layer (peak concentration) was about $2.6 \times 10^{17}$ atoms/cm$^3$.

Next, the charge balance between the impurity amount of the p type impurity layer PIL and the impurity amount of the n-type drift layer NDL will be described. Here, as shown in FIG. 23, the amount of impurities in the p type impurity layer PIL and the amount of impurities in the n-type drift layer NDL at one depth position (cross-sectional line XXIV-XXIV shown in FIG. 23) and other depth position (cross-sectional line XXV-XXV shown in FIG. 23) in the cross section along the directions in which the adjacent columnar conductors CCBs are arranged will be described.

Figure 23:
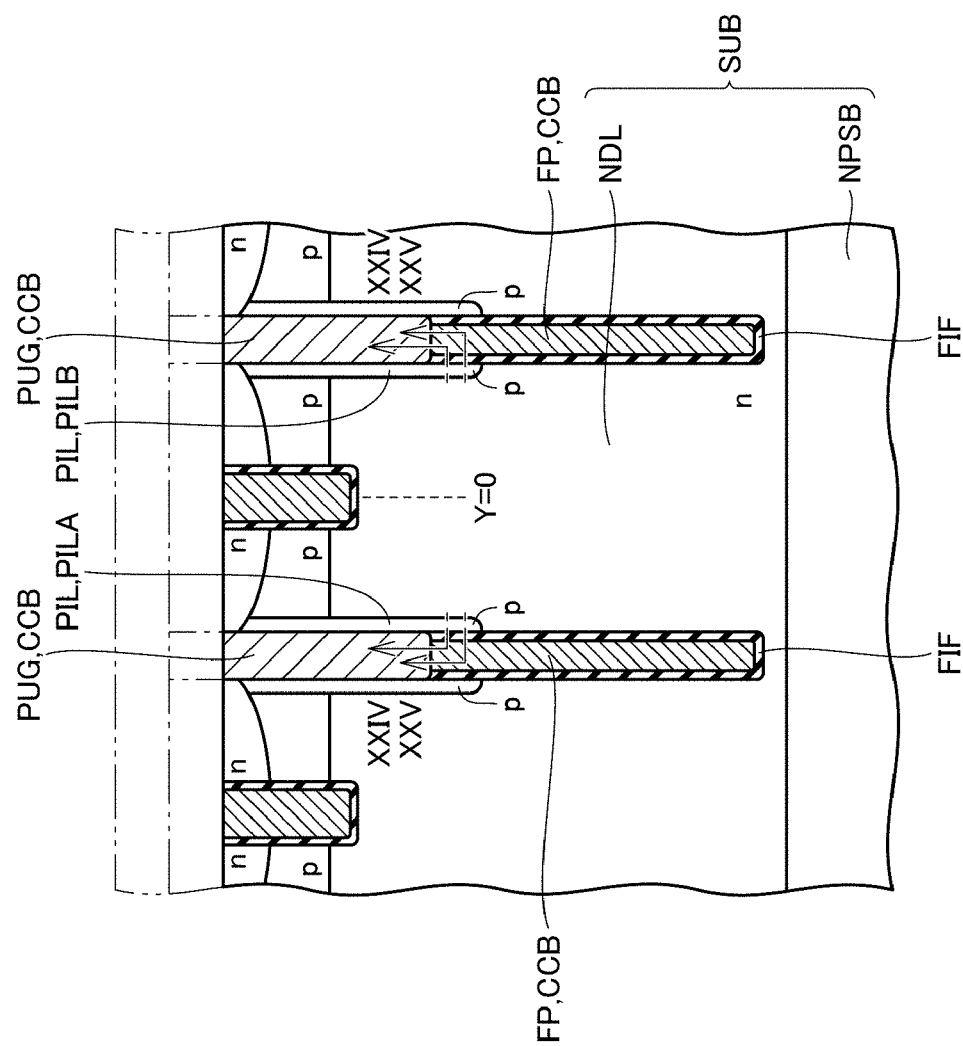
FIG. 23 is a cross-sectional view for explaining charge balancing between a p type impurity layer and an n-type drift layer in the first embodiment.
Figure 24:
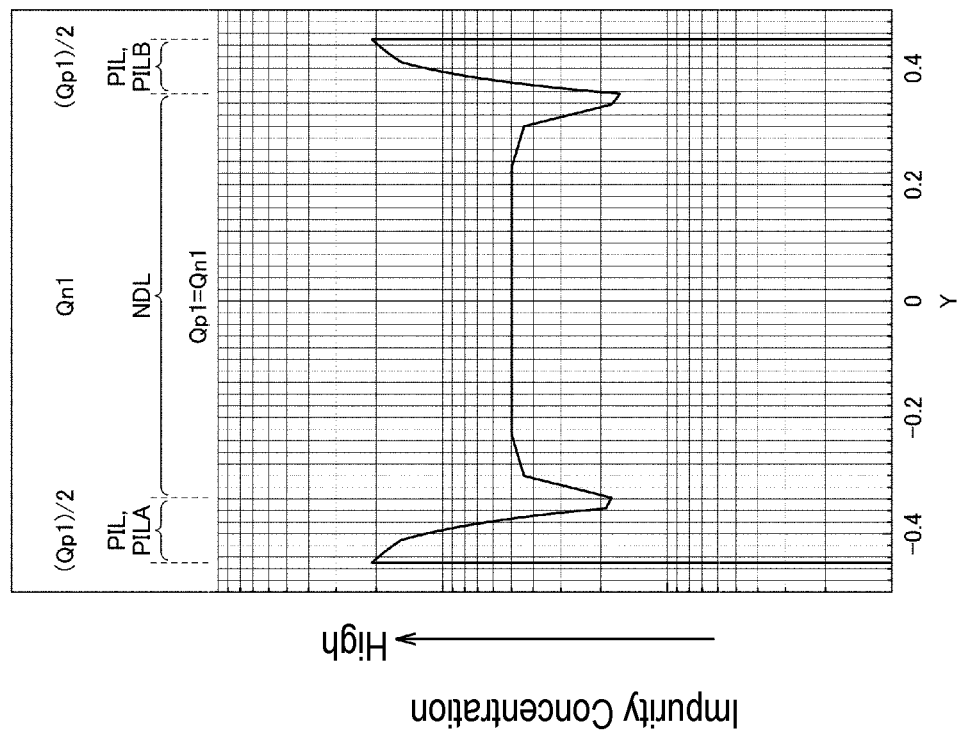
FIG. 24 is a diagram showing an example of a profile of impurity concentrations of a p type impurity layer and an n-type drift layer in the cross-sectional line XXIV-XXIV shown in FIG. 23.

First, FIG. 24 shows a profile of impurity concentrations along the cross-sectional line XXIV-XXIV shown in FIG. 23. The horizontal axis represents a position (coordinate) at which the center of the gate electrode shown in FIG. 23 is Y=0. The vertical axis represents the impurity concentration. In FIG. 24, profiles of impurity concentrations at respective depth positions of the p type impurity layer PILA on one pillar conductor CCB side, the p type impurity layer PILB on the other columnar conductor CCB side, and the n-type drift layer NDL located between the p type impurity layer PILA and the p type impurity layer PILB are shown.

Here, the amount of impurities based on the impurity concentrations of the p type impurity layers PILA at one depth position is assumed to be (Qp1)/2. The amount of impurities based on the impurity concentrations of the p type impurity layers PILB at one depth position is defined as (Qp1)/2. Let Qn1 be the amount of impurities based on the impurity concentrations of the n-type drift-layer NDL at one depth position of the n-type drift-layer NDL. Each impurity amount corresponds to the area of the profile of the corresponding impurity concentration.

Then, the sum total of the p type impurity amounts is (Qp1)/2+(Qp1)/2=Qp1. In the semiconductor device PSDs, the impurity concentrations of the p type impurity layer PIL and the n-type drift layer NDL are set so that the total Qp1 of the p type impurity amounts is equal to the n-type impurity amount Qn1.

Figure 25:
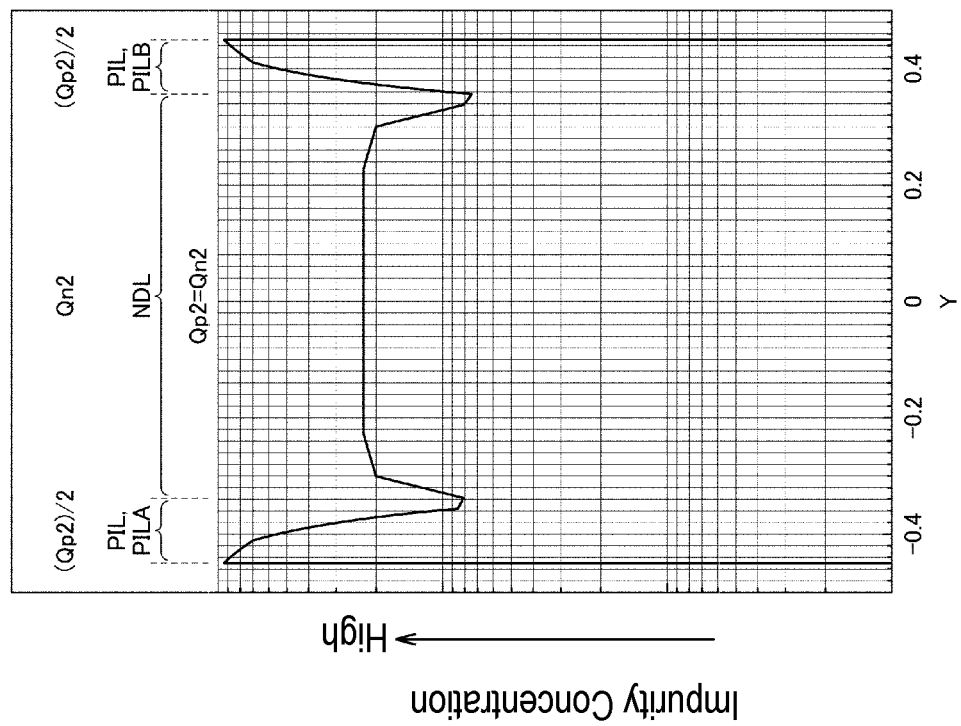
FIG. 25 is a diagram showing examples of profiles of impurity concentrations of a p type impurity layer and an n-type drift layer in the cross-sectional line XXV-XXV shown in FIG. 23.

Next, FIG. 25 shows a profile of impurity concentrations along the cross-sectional line XXV-XXV shown in FIG. 23. The horizontal axis represents the position where Y=0 is the center of the gate electrode shown in FIG. 23. The vertical axis represents the impurity concentration. FIG. 25 shows profiles of impurity concentrations at other depth positions of the p type impurity layer PILA on one pillar conductor CCB side, the p type impurity layer PILB on the other columnar conductor CCB side, and the n-type drift layer NDL located between the p type impurity layer PILA and the p type impurity layer PILB.

Here, the amount of impurities based on the impurity concentrations of the p type impurity layers PILA at other depth positions is assumed to be (Qp2)/2. Let the amount of impurities based on the impurity concentrations of the p type impurity layers PILB at other depth positions be (Qp2)/2. Let Qn2 be the amount of impurities based on the impurity concentrations of the n-type drift-layer NDL at other depth positions. Each impurity amount corresponds to the area of the profile of the corresponding impurity concentration.

Then, the sum total of the p type impurity amounts is (Qp2)/2+(Qp2)/2=Qp2. In the semiconductor device PSDs, the impurity concentrations of the p type impurity layer PIL and the n-type drift layer NDL are set so that the total Qp2 of the p type impurity amounts is equal to the n-type impurity amount Qn2. Note that the Qp2=Qn2 is not intended to be strictly equal in Qp2 and Qn2, and includes an error range of ±10% in manufacturing variations.

As shown in FIGS. 24 and 25, the impurity concentrations of the p type impurity layer PIL and the n-type drift layer NDL at one depth position and the impurity concentrations of the p type impurity layer PIL and the n-type drift layer NDL at the other depth positions are different from each other, not the same impurity concentration.

However, at one depth position, the total Qp1 of the p type impurity amounts is equal to the n-type impurity amount Qn1. At other depth positions, the total Qp2 of the p type impurity amounts is equal to the n-type impurity amount Qn2. Thus, in the semiconductor device PSDs, the highest withstand voltage can be ensured by charge balancing.

Figure 26:
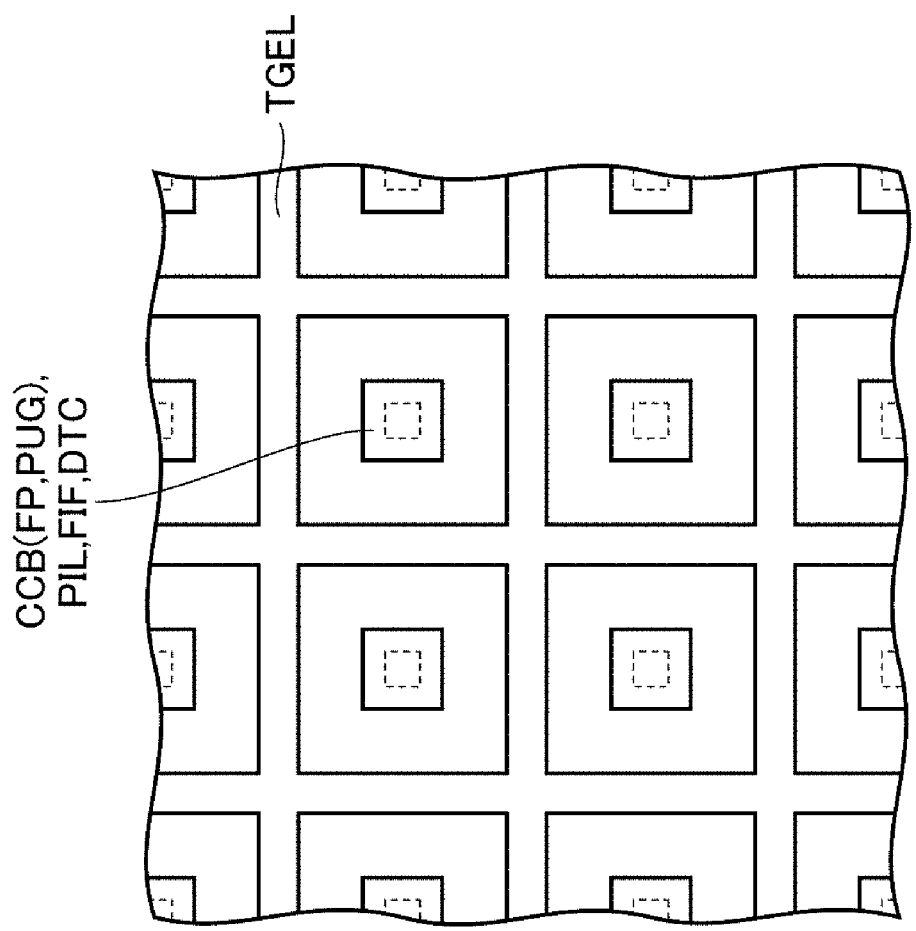
FIG. 26 is a partial plan view showing a modified example of a planar arrangement pattern of arrangement of a gate electrode in each of embodiments.
Figure 27:
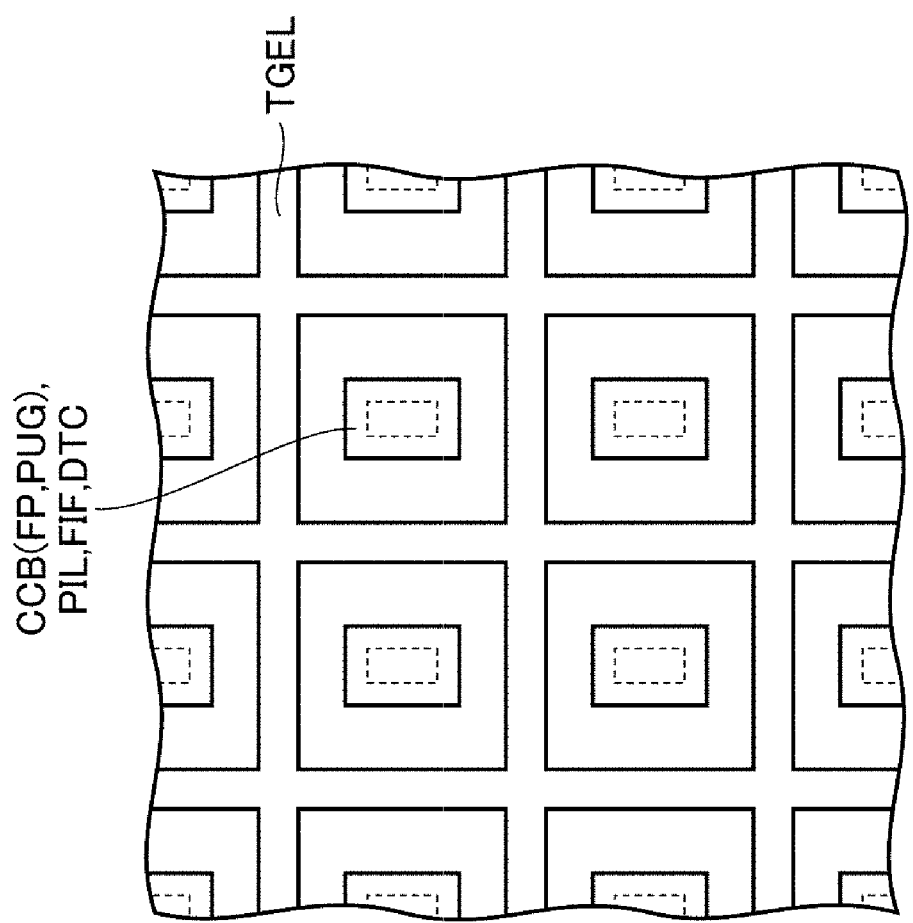
FIG. 27 is a partial plan view showing a first modified example of a planar configuration of a pillar conductor including a field plate in each of embodiments.
Figure 28:
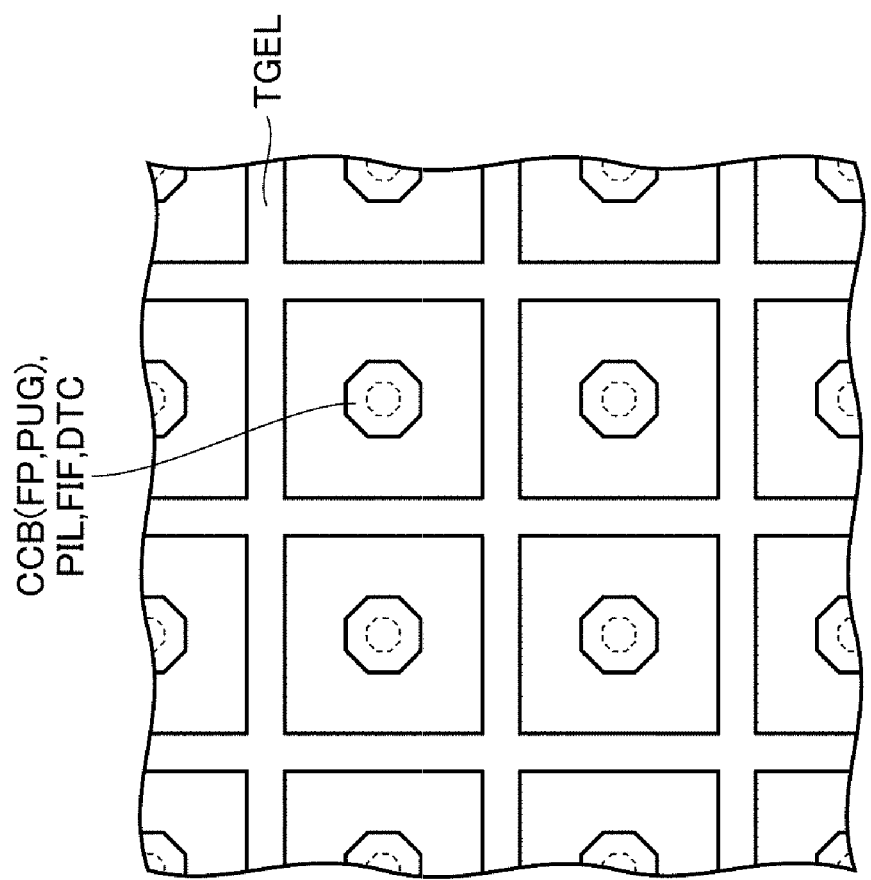
FIG. 28 is a partial plan view showing a second modified example of the planar configuration of the pillar conductor including the field plate in each of embodiments.
Figure 29:
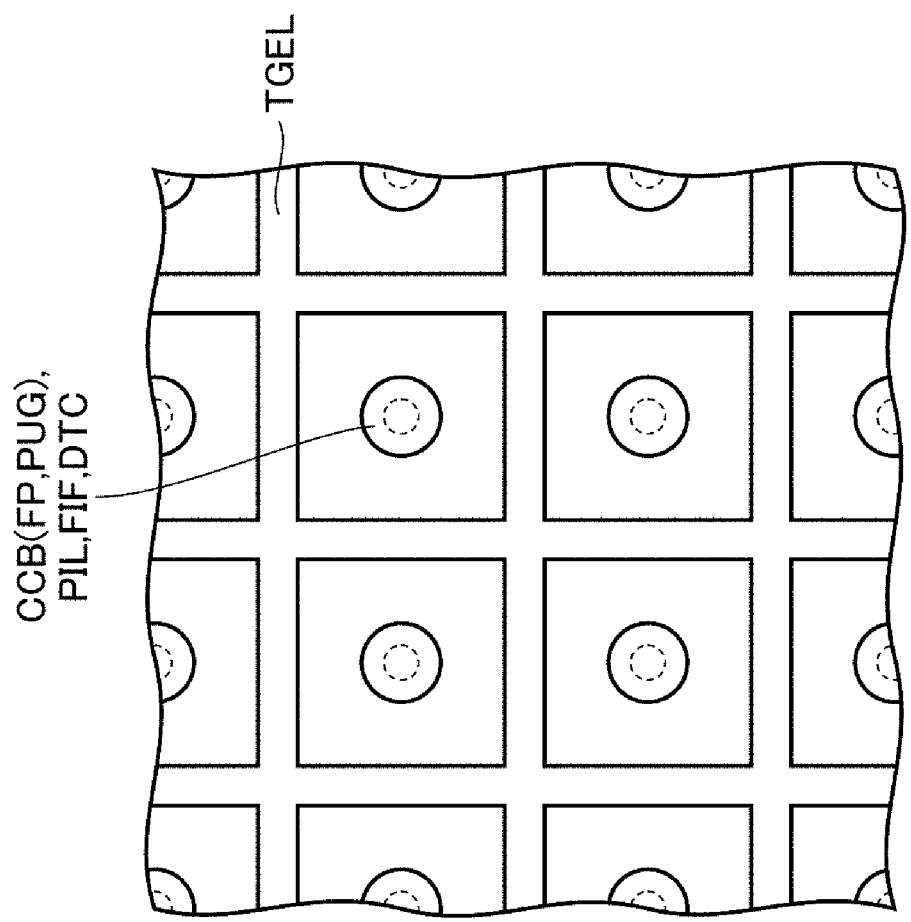
FIG. 29 is a partial plan view showing a third modified example of the planar configuration of the pillar conductor including the field plate in each of embodiments.

In the above-described semiconductor device, the planar pattern of the gate trench GTC in which the gate electrodes TGEL are formed is exemplified by a mesh pattern in which the pitches of the gate trenches GTC are shifted as shown in FIG. 3 or FIG. 4. The plane pattern of the gate trench GTC may be a mesh pattern having a uniform pitch, as shown in FIG. 26. The planar shape of the pillar conductor CCB has been described by taking a square shape as an example. The planar shape of the pillar conductor CCB may be, for example, a rectangle as shown in FIG. 27. As shown in FIG. 28, the shape may be an octagonal, or may be a circular, as shown in FIG. 29.

Embodiment 2

Figure 30:
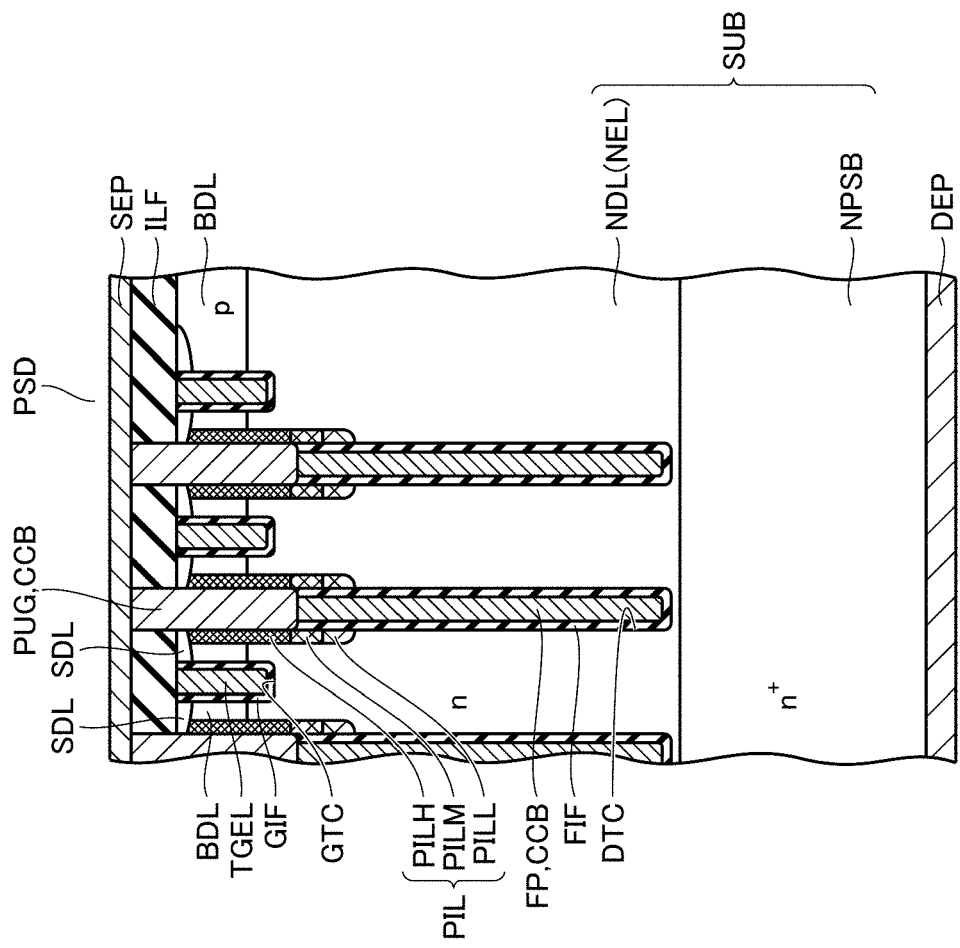
FIG. 30 is a cross-sectional view of a semiconductor device according to a second embodiment corresponding to the cross-sectional line II-II shown in FIG. 1.

An example of a semiconductor device according to the second embodiment will be described. As shown in FIG. 30, p type impurity layers PIL are formed at a predetermined depth (second depth) from the first main surface of the semiconductor substrate SUBs for each of the plurality of columnar conductors CCB. The p type impurity layer PIL includes a p type impurity layer PILH, a p type impurity layer PILM, and a p type impurity layer PILL.

The impurity concentrations of the p type impurity layers PILL are, for example, $10^{17}$ atoms/cm$^3$. The impurity concentration of the p type impurity layer PILM is higher than the impurity concentration of the p type impurity layer PILL, for example, about $10^{18}$ atoms/cm$^3$. The impurity concentration of the p type impurity layer PILH is higher than the impurity concentration of the p type impurity layer PILM, for example, about $10^{19}$ atoms/cm$^3$. Since other configurations are the same as those of the semiconductor device shown in FIG. 2 and the like, the same members are denoted by the same reference numerals, and descriptions thereof will not be repeated except when required.

Figure 31:
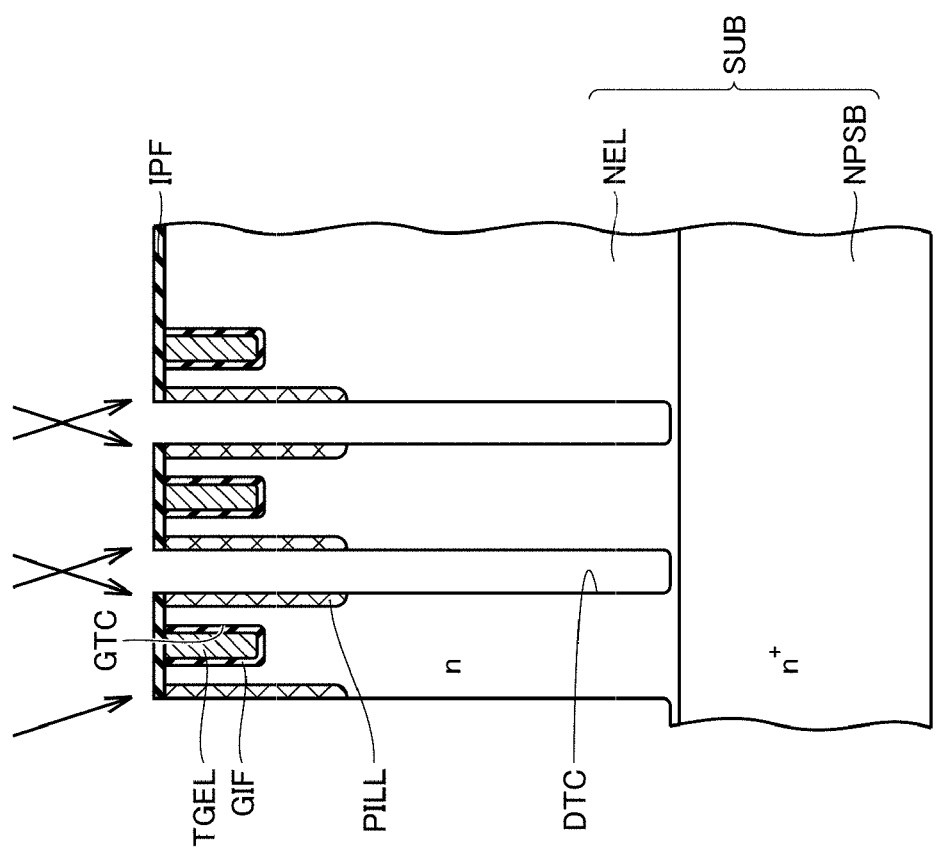
FIG. 31 is a cross-sectional view showing one step of manufacturing method of a semiconductor device in the second embodiment.

Next, an exemplary manufacturing method of the above-described semiconductor device will be described. First, after a process substantially similar to the process shown in FIGS. 6 to 8 is performed, p type impurities are implanted into the sidewall surface of the deep trench DTC at a first implantation angle and a first dose as shown in FIG. 31. As a result, portions to be p type impurity layers PILL are formed.

Figure 32:
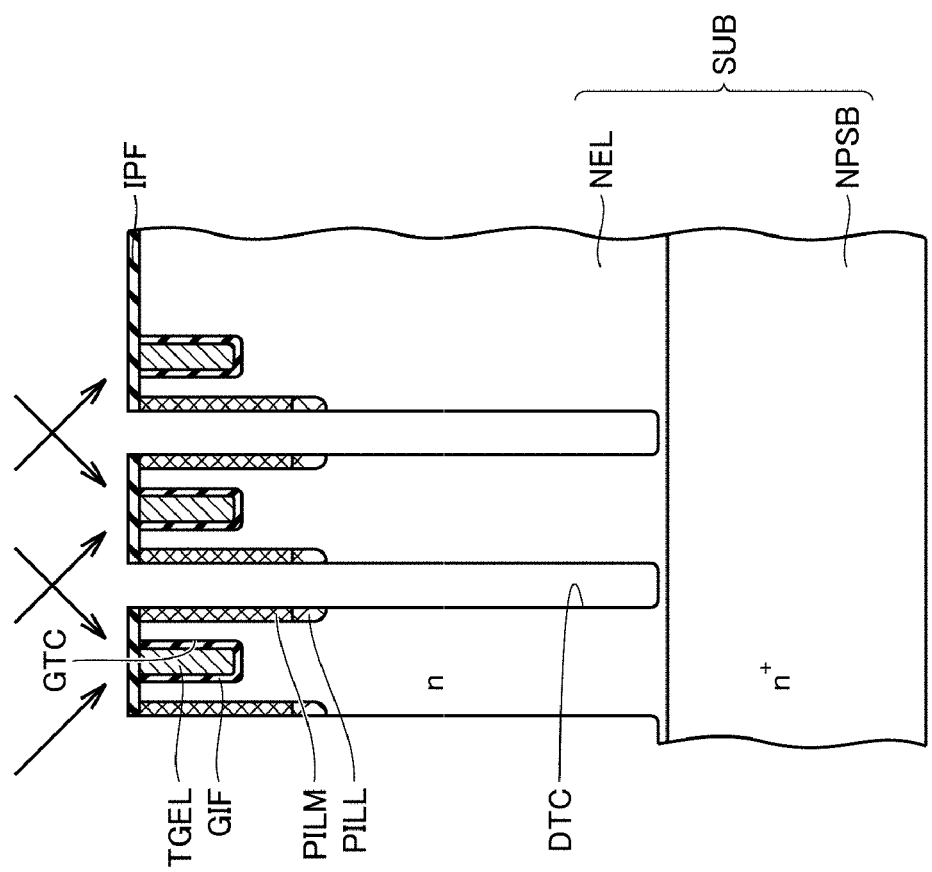
FIG. 32 is a cross-sectional view showing a step performed after the process shown in FIG. 31.

Next, as shown in FIG. 32, a p type impurity is implanted into the sidewall surface of the deep trench DTC with the second implantation angle and the second dose. The second injection angle is greater than the first injection angle. The second dose amount is higher than the first dose amount. As a result, a portion to be the p type impurity layer PILM is formed, leaving a portion of the p type impurity layer PILL.

Figure 33:
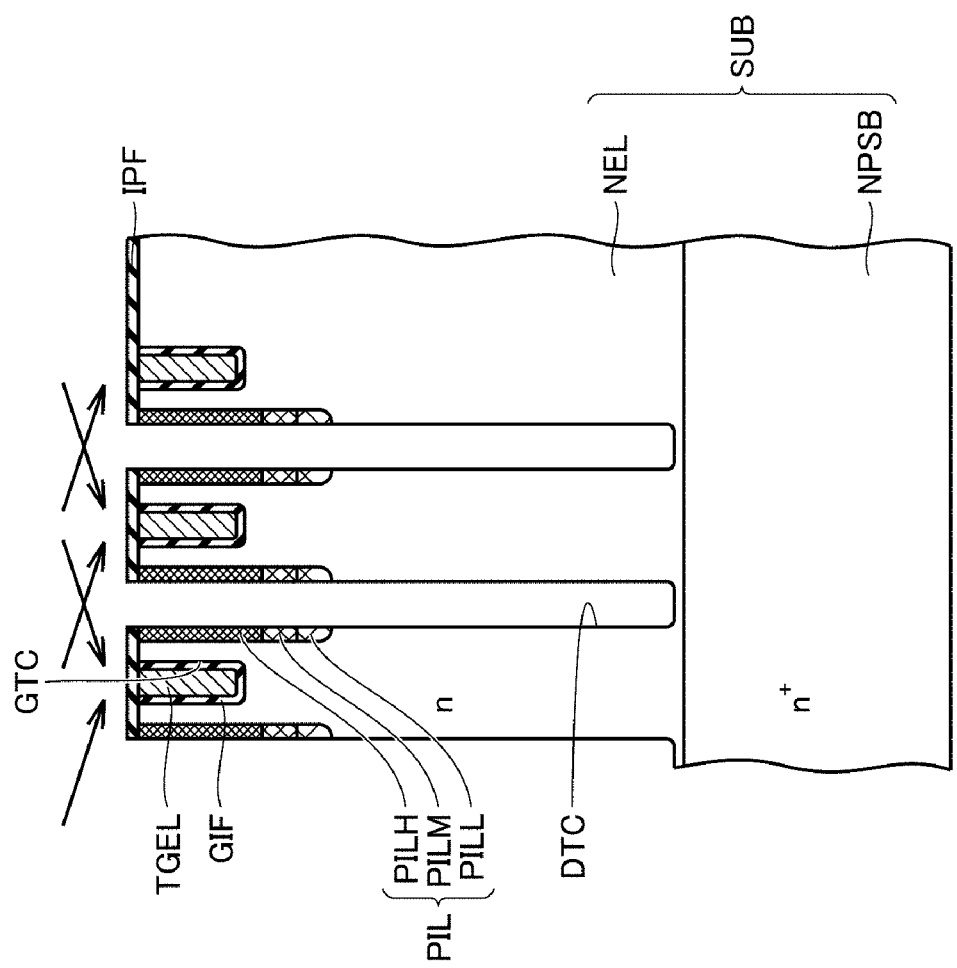
FIG. 33 is a cross-sectional view showing a process performed after the process shown in FIG. 32.

Next, as shown in FIG. 33, a p type impurity is implanted into the sidewall surface of the deep trench DTC with a third implantation angle and a third dose amount. The third injection angle is greater than the second injection angle. The third dose amount is higher than the second dose amount. Thus, the p type impurity layer PILH is formed while leaving a part of the p type impurity layer PILL and a part of the p type impurity layer PILM. Thereafter, the main part of the semiconductor device shown in FIG. 30 is completed through the same steps as those shown in FIGS. 10 to 15.

In the semiconductor device PSDs described above, the p type impurity layer PIL includes the p type impurity layer PILH, the p type impurity layer PILM, and the p type impurity layer PILL. The impurity concentration of the p type impurity layer PILM is higher than the impurity concentration of the p type impurity layer PILL. The impurity concentration of the p type impurity layer PILH is higher than the impurity concentration of the p type impurity layer PILM.

Figure 34:
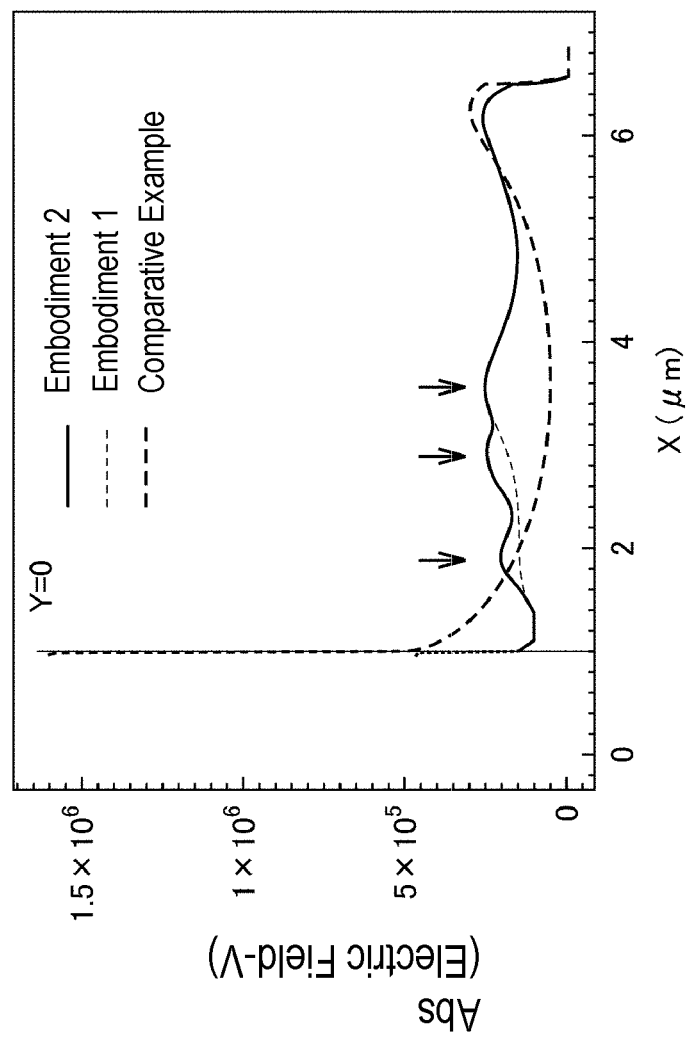
FIG. 34 is a graph showing a relationship between a depth direction of an n-type drift layer and an electric field strength under a gate electrode in the second embodiment.

The inventors considered that three peaks appeared as the electric field intensities described in FIG. 20 in the semiconductor device PSD including the p type impurity layers PILs having three different impurity concentrations described above based on the results of evaluations by simulations performed on the semiconductor device PSD according to the first embodiment. That is, as shown in FIG. 34, in addition to the peak of the electric field strength corresponding to the p type impurity layer PILL, the peak of the electric field strength corresponding to the p type impurity layer PILM and the peak of the electric field strength corresponding to the p type impurity layer PILH appeared (see the solid line in the second embodiment).

The inventors have considered that, by adding such peaks of the electric field strength, the integral value of the electric field strength in the depth direction becomes larger than the integral value of the semiconductor device described in the first embodiment, refer to the first embodiment, and as a result, the withstand voltage is further improved.

Furthermore, it has been found that the above-mentioned semiconductor device improves the resistance to avalanche breakdown. This will be explained. The avalanche breakdown is a mode in which the spike voltage exceeds the drain rated withstand voltage of the MOS transistor and enters the breakdown region and breaks down due to, for example, a fly-back voltage generated at the time of a switching-off operation in an inductive load.

When breakdown occurs at a position where the electric field around the gate electrode TGEL is strong, carriers are generated, holes are pulled out to the source electrode pad SEP side, and electronics are pulled out to the drain electrode pad DEP side. At this time, when holes flow from the n-type drift layer NDL to the p type base diffusion layer BDL, a potential difference is generated by the resistor and electrons are injected from the n+ type source diffusion layer SDL to the p type base diffusion layer BDL, a parasitic bipolar transistor operates. That is, a parasitic NPN type bipolar transistor composed of the n+ type source diffusion layer SDL, the p type base diffusion layer BDL, and the n-type drift layer NDL operates, and a current flows from the drain electrode pad DEP to the source electrode pad SEP.

In the semiconductor device PSDs described above, the p type impurity layers PILs are formed along the side surfaces of the deep trenches DTC. The p type impurity layer PIL contacts the plug PUG on the sidewall surface of the deep trench DTC, and contacts the n-type drift layer NDL and the p type base diffusion layer BDL in the depth direction. This arrangement structure ensures a sufficient contact area between the plug PUG electrically connected to the source electrode pad SEP and the p type impurity layer PIL. The contact area between the n-type drift layer NDL, the p type base diffusion layer BDL, and the p type impurity layer PIL is sufficiently secured. In addition, in the p type impurity layer PIL, the p type impurity layer PILH having relatively high impurity concentrations contacts the p type base diffusion layer BDL and the plugs PUG.

Therefore, when breakdown occurs, of the holes flowing from the n-type drift layer NDL into the p type base diffusion layer BDL, the number of components of the holes flowing from the p type base diffusion layer BDL into the plugs PUG through the p type impurity layer PILH increases. In addition, the number of components of holes flowing from the n-type drift layer NDL into the plug PUG through the p type impurity layer PIL increases. As a result, the components of the holes flowing in the vicinity of the gate electrodes TGEL are reduced. As a result, the number of electrons injected from the n+ type source diffusion layer SDL to the p type base diffusion layer BDL is reduced, and the operation of the parasitic NPN type bipolar transistor can be suppressed. Thus, avalanche resistance can be improved.

Embodiment 3

Figure 35:
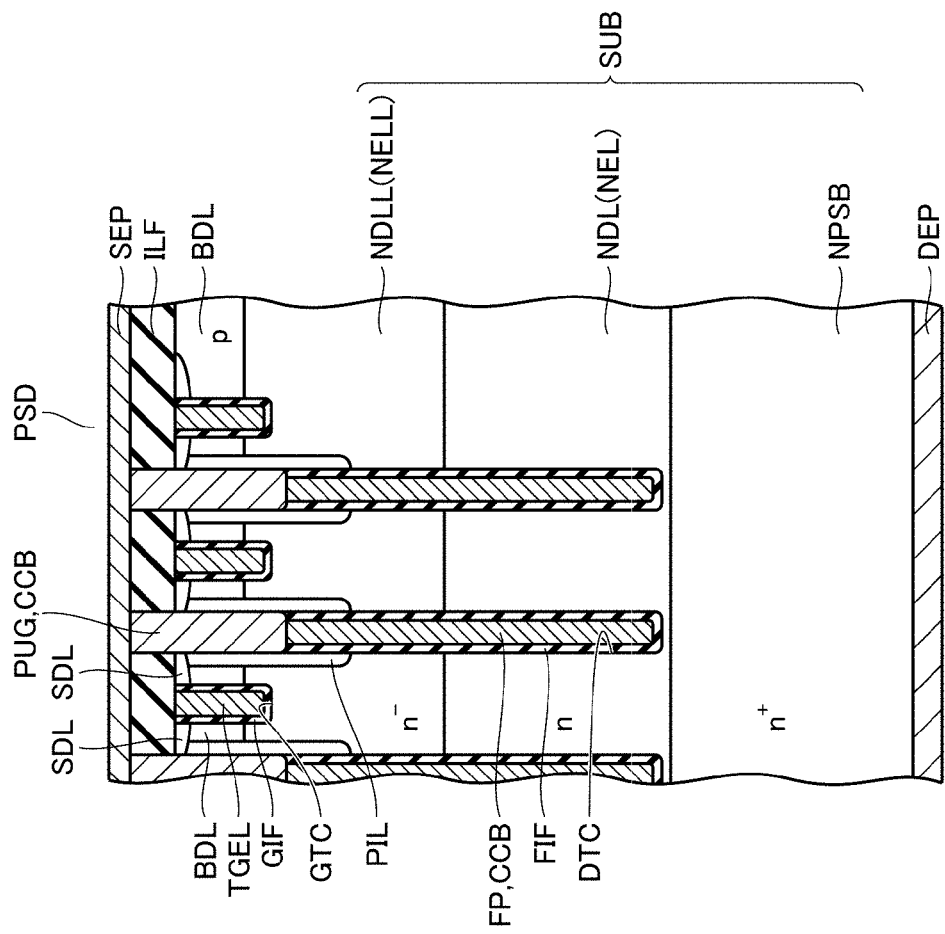
FIG. 35 is a cross-sectional view of a semiconductor device according to a third embodiment in a cross-sectional line corresponding to the cross-sectional line II-II shown in FIG. 1.

An example of a semiconductor device according to the third embodiment will be described. As shown in FIG. 35, the semiconductor substrate SUB includes an n+ type substrate NPSB, an n type epitaxial layer NEL, and an n− type epitaxial layer NELL. The impurity concentrations of the n type epitaxial layers NEL are, for example, about $10^{16}$ atoms/cm$^3$. The impurity concentration of the n− type epitaxial layer NELL is, for example, about $10^{15}$ atoms/cm$^3$.

The n type epitaxial layer NEL becomes an n-type drift layer NDL. The n− type epitaxial layer NELL becomes an n− type drift layer NDLL. A plurality of columnar conductors CCBs are formed from the first main surface of the semiconductor substrate SUB through the n− type epitaxial layer NELL to a predetermined depth in the n type epitaxial layer NEL. Since other configurations are the same as those of the semiconductor device shown in FIG. 2 and the like, the same members are denoted by the same reference numerals, and descriptions thereof will not be repeated except when required.

Figure 36:
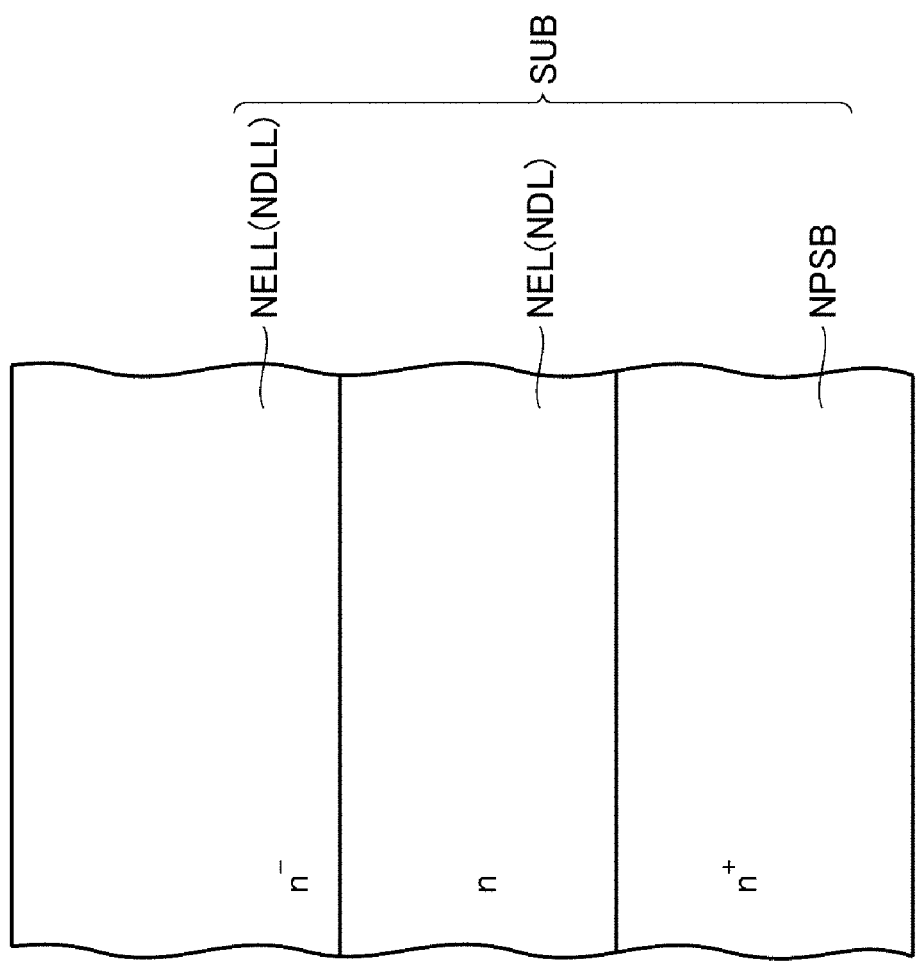
FIG. 36 is a cross-sectional view showing one step of manufacturing method of a semiconductor device in the third embodiment.

Next, an exemplary manufacturing method of the above-described semiconductor device will be described. First, as shown in FIG. 36, n-type epitaxial layers NELs are formed on the surfaces of n+ type substrate NPSBs by epitaxial growth. An n-type epitaxial layer NELL is formed on the surface of the n type epitaxial layer NEL by epitaxial growth. The impurity concentration of the n− type epitaxial layer NELL is lower than the impurity concentration of the n type epitaxial layer NEL. The semiconductor substrate SUB is formed by the n+ type substrate NPSB, the n type epitaxial layer NEL, and the n− type epitaxial layer NELL. Thereafter, the main part of the semiconductor device shown in FIG. 35 is completed through the same steps as those shown in FIGS. 7 to 15.

Figure 37:
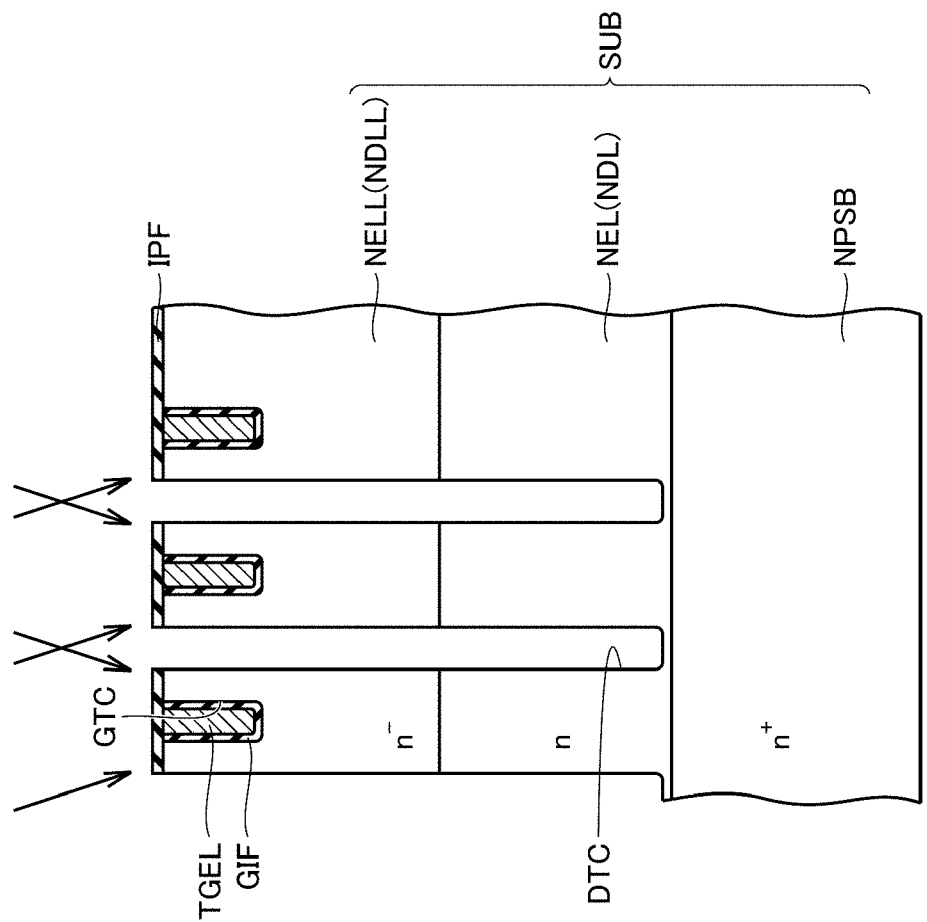
FIG. 37 is a cross-sectional view showing one step of manufacturing method of a semiconductor device according to a modified example in the third embodiment.

Further, as another exemplary manufacturing method of the above-mentioned semiconductor device, it may be manufactured as follows. After the same steps as those shown in FIGS. 6 to 8 are performed, p type impurities are implanted from the sidewalls of the deep trench DTC or the like, as shown in FIG. 37. Thereafter, heat treatment is performed. As a result, the n-type impurity of the n type epitaxial layer NEL located over a predetermined depth from the surface of the n type epitaxial layer NEL is offset by the p type impurity, and an n− type epitaxial layer NELL having an impurity concentration lower than the impurity concentration of the n type epitaxial layer NEL is formed. Thereafter, the main part of the semiconductor device shown in FIG. 35 is completed through the same steps as those shown in FIGS. 9 to 15.

In the semiconductor device PSD described above, an n-type drift layer NDLL having an impurity concentration lower than the impurity concentration of the n− type drift layer NDL is formed. A plurality of columnar conductors CCB each including a field plate FP are formed in a deep trench DTC that penetrates the n-type epitaxial layer NELL and reaches the n type epitaxial layer NEL from the first main surface of the semiconductor substrate SUB. A p type impurity layer PIL in contact with the p type base diffusion layer BDL and the n− type drift layer NDLL (n− type epitaxial layer NELL) is formed along the side wall surface of the deep trench DTC.

Figure 38:
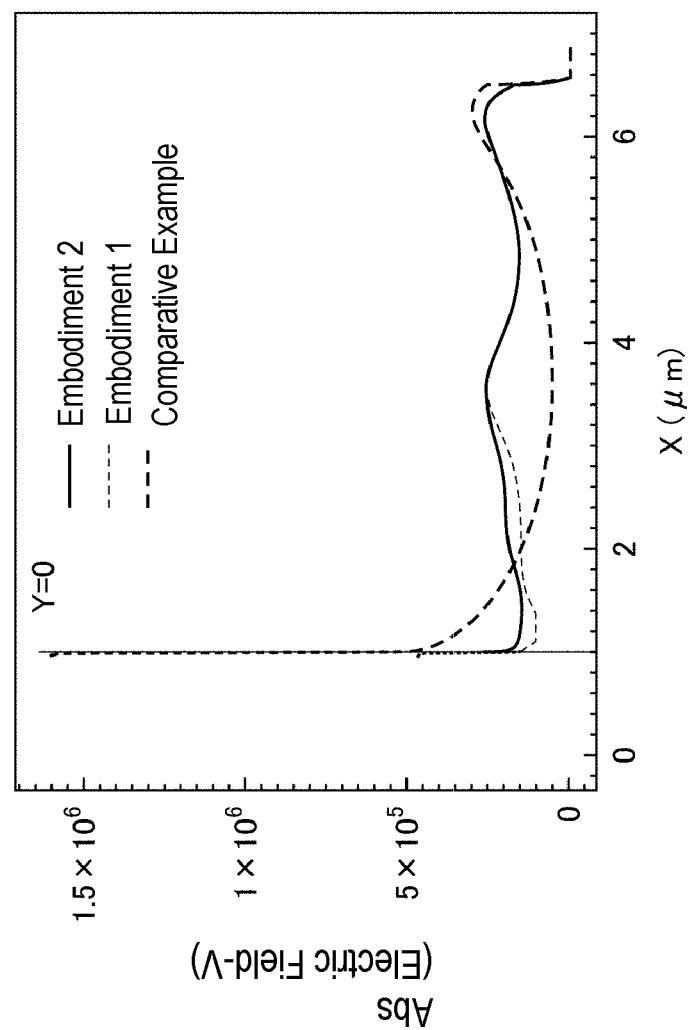
FIG. 38 is a graph showing a relationship between a depth direction of an n-type drift layer and an electric field strength under a gate electrode in the third embodiment.

Based on the results of evaluations performed on the semiconductor device PSD according to the first embodiment, the inventors considered that in the semiconductor device PSD including the n− type drift layer NDLL in contact with the p type impurity layer PIL described above, the electric field strength increased in the depth direction in which the n− type drift layer NDLL was located. That is, as shown in FIG. 38, the base of the electric field strength in the region where the n-type drift layer NDLL is located is considered to be higher than the base of the electric field strength of the semiconductor device PSDs described in the first embodiment (refer to the solid line in the third embodiment).

The inventors have considered that the increase in the base of the electric field strength increases the integral value of the electric field strength in the depth direction as compared with the integral value of the semiconductor device PSDs described in the first embodiment, refer to the first embodiment, and as a result, the breakdown voltage is further improved.

Note that the semiconductor device described in the respective embodiments can be combined in various manners as required. The dependent relationships of the claims according to the embodiments are also envisaged.

Although the invention made by the present inventor has been specifically described based on the embodiments, the present invention is not limited to the embodiments described above, and it is needless to say that various modifications can be made without departing from the gist thereof.

What is claimed is:

1. A semiconductor device comprising:
   a semiconductor substrate of a first conductivity type having a first main surface and a second main surface opposite to the first main surface;
   a first electrode formed on the first main surface of the semiconductor substrate;
   a second electrode formed on the second main surface of the semiconductor substrate;
   a plurality of columnar conductors formed in the semiconductor substrate and being electrically connected to the first electrode, each of the plurality of columnar conductors extending between the first main surface and a first depth in the semiconductor substrate, the first depth in the semiconductor substrate being measured from the first main surface toward the second main surface;
   a first impurity region of a second conductivity type formed in the semiconductor substrate and being electrically connected to the first electrode, the first impurity region extending between the first main surface and a second depth in the semiconductor substrate, the second depth in the semiconductor substrate being measured from the first main surface toward the second main surface, the second depth being shallower than the first depth;

a second impurity region of the second conductivity type formed in the semiconductor substrate and being electrically connected to the first electrode, the second impurity region extending between the first main surface and a third depth in the semiconductor substrate, the third depth in the semiconductor substrate being measured from the first main surface toward the second main surface, the third depth being shallower than the second depth;

a third impurity region of the first conductivity type formed in the semiconductor substrate and being electrically connected to the first electrode, the third impurity region extending between the first main surface and a fourth depth in the semiconductor substrate, the fourth depth in the semiconductor substrate being measured from the first main surface toward the second main surface, the fourth depth being shallower than the third depth; and a gate electrode formed in a gate trench in the semiconductor substrate via a gate dielectric film so as to penetrate the third impurity region and the second impurity region, wherein the first impurity region is in contact with each of the semiconductor substrate of the first conductivity type and the second impurity region of the second conductivity type, wherein each of the plurality of columnar conductors includes a field plate, the field plate extending from a fifth depth to the first depth in the semiconductor substrate, the fifth depth in the semiconductor substrate being measured from the first main surface toward the second main surface, the fifth depth being shallower than the first depth and the second depth and deeper than the third depth and the fourth depth, the field plate and the semiconductor substrate of the first conductivity type being arranged to be opposite to each other via an insulating film, wherein i) a first portion of the field plate extending between the fifth depth and the second depth in the semiconductor substrate and ii) the first impurity region are opposed to each other via the insulating film, wherein, in a region between the second depth and the first depth, i) a second portion of the field plate extending between the second depth and the first depth in the semiconductor substrate and ii) the semiconducting substrate of the first conductivity type are opposed to each other via the insulating film, and wherein a length of a portion of the first impurity region extending from the fifth depth to the second depth in the semiconductor substrate is set to substantially half a length of the field plate extending from the fifth depth to the first depth in the semiconductor substrate.

2. The semiconductor device according to claim 1,
wherein each of the plurality of columnar conductors is formed in a deep trench, the deep trench reaching a portion of the semiconductor substrate of the first conductivity type from the first main surface in such a manner as to penetrate the third impurity region and the second impurity region.

3. The semiconductor device according to claim 2,
wherein each of the plurality of columnar conductors is formed in the deep trench such that each of the plurality of columnar conductors extends between the first main surface of the semiconductor substrate and the fifth depth, and
wherein each of the plurality of columnar conductors includes a plug contacting the field plate and the first impurity region.

4. The semiconductor device according to claim 1,
wherein the first impurity region includes a first portion having a first impurity concentration and a second portion having a second impurity concentration higher than the first impurity concentration, and
wherein the second portion of the first impurity region is located on a near side of the first main surface than the first portion of the first impurity region.

5. The semiconductor device according to claim 1,
wherein the semiconductor substrate of the first conductivity type includes a first layer having a third impurity concentration and a second layer having a fourth impurity concentration lower than the third impurity concentration,
wherein the second layer is located closer to the first main surface than the first layer, and
wherein each of the plurality of columnar conductors is formed to reach the first layer, and the gate electrode is formed to reach the second layer.

6. The semiconductor device according to claim 1,
wherein each of the plurality of columnar conductors has a shape of any one of a square, a circular, or an octagonal in a plan view.

* * * * *